(12) United States Patent
Sato et al.

(10) Patent No.: US 6,855,626 B2
(45) Date of Patent: Feb. 15, 2005

(54) WIRING SUBSTRATE HAVING POSITION INFORMATION

(75) Inventors: Yukio Sato, Nagano (JP); Akihiro Oku, Nagano (JP); Masayoshi Aoki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/637,552

(22) Filed: Aug. 11, 2003

(65) Prior Publication Data

US 2004/0026767 A1 Feb. 12, 2004

Related U.S. Application Data

(62) Division of application No. 10/179,981, filed on Jun. 26, 2002.

(30) Foreign Application Priority Data

Jun. 27, 2001 (JP) .......................................... 2001-194760

(51) Int. Cl.[7] .......................................... H01L 21/4763
(52) U.S. Cl. ....................... 438/622; 438/623; 438/624; 438/625
(58) Field of Search ................................ 438/622, 623, 438/624, 625

(56) References Cited

U.S. PATENT DOCUMENTS

| | | | |
|---|---|---|---|
| 3,760,384 A | 9/1973 | Krolikowski et al. | |
| 4,426,773 A | 1/1984 | Hargis | |
| 4,864,722 A | 9/1989 | Lazzarini et al. | |
| 5,541,368 A | * | 7/1996 | Swamy .......................... 174/266 |
| 5,612,576 A | 3/1997 | Wilson et al. | |
| 5,615,477 A | * | 4/1997 | Sweitzer ........................ 29/840 |
| 5,710,071 A | * | 1/1998 | Beddingfield et al. ...... 438/108 |
| 5,756,380 A | * | 5/1998 | Berg et al. .................... 438/126 |
| 5,808,873 A | 9/1998 | Celaya et al. | |
| 5,811,883 A | 9/1998 | Ichikawa et al. | |
| 5,841,192 A | 11/1998 | Exposito | |
| 5,990,545 A | 11/1999 | Schueller et al. | |
| 5,990,547 A | 11/1999 | Sharma et al. | |
| 6,002,178 A | 12/1999 | Lin | |
| RE36,773 E | 7/2000 | Nomi et al. | |
| 6,246,015 B1 | 6/2001 | Kim | |
| 6,602,734 B1 | 8/2003 | Wada et al. | |

FOREIGN PATENT DOCUMENTS

| | | |
|---|---|---|
| EP | 0948250 A1 | 10/1999 |
| GB | 2343059 | 4/2000 |
| JP | 5-129384 | 5/1993 |

OTHER PUBLICATIONS

European Search Report dated Jul. 20, 2004.
Patent Abstracts of Japan, Publication No. 10–215041, Published Aug. 11, 1998.
U.S. Appl. No. 10/179,981, filed Jun. 26, 2002, Sato et al.

* cited by examiner

Primary Examiner—Jasmine Clark
(74) Attorney, Agent, or Firm—Staas & Halsey, LLP

(57) ABSTRACT

A method for producing a wiring board for a semiconductor package having a base substrate with first and second surfaces; a wiring layer including wiring patterns formed on at least one of the first and second surfaces; a plurality of semiconductor element mounting areas formed on the surface of the base substrate on which the wiring layer is formed; and individual patterns as position information formed for the respective semiconductor element mounting areas, the individual patterns having a different shape for each of the respective semiconductor element mounting areas. The individual patterns as position information are formed on peripheral regions of the respective semiconductor element mounting areas.

8 Claims, 21 Drawing Sheets

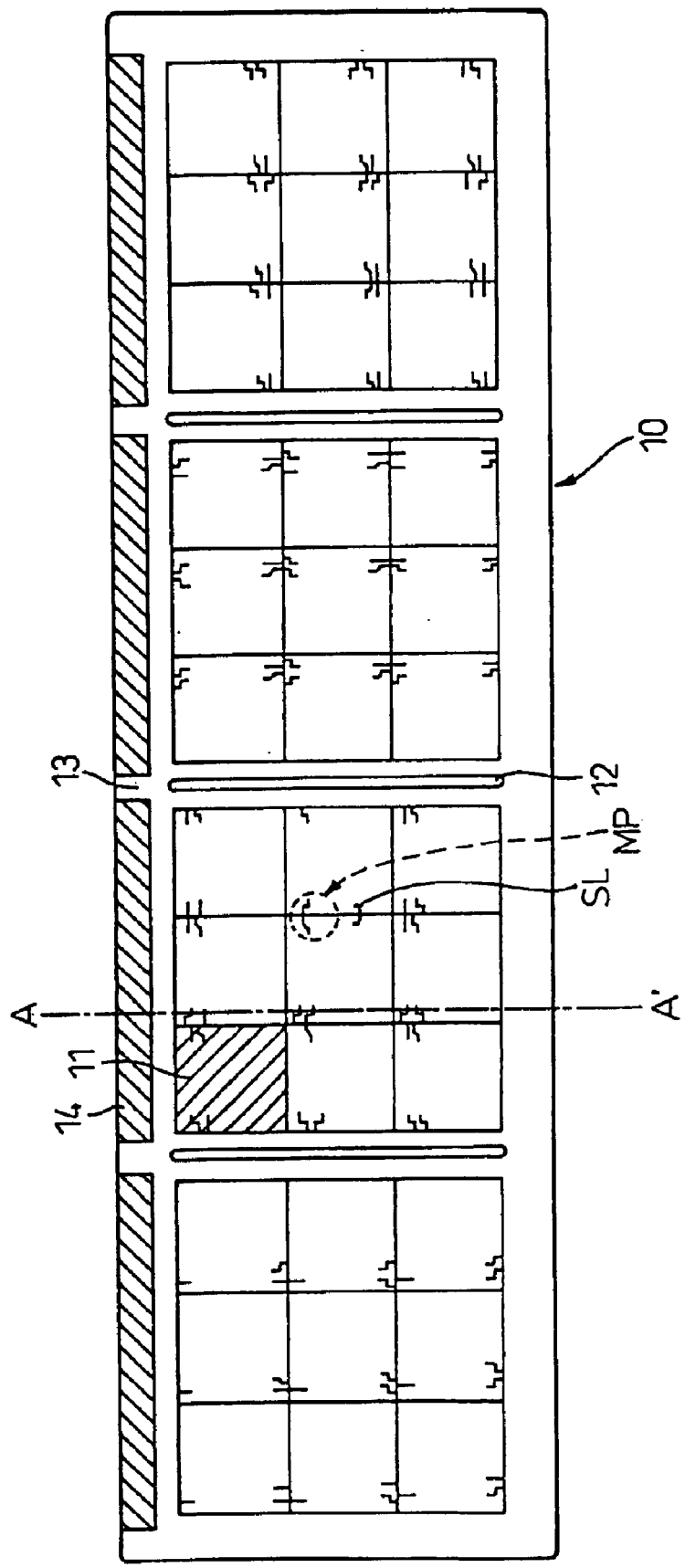

UV RADIATION

UV RADIATION

WP  MP  23

40  33

MP

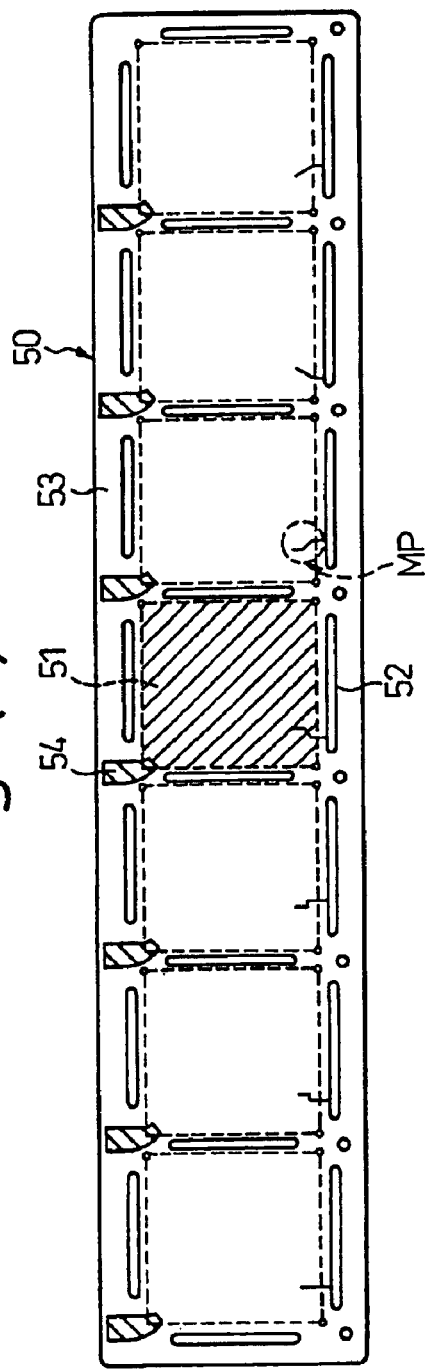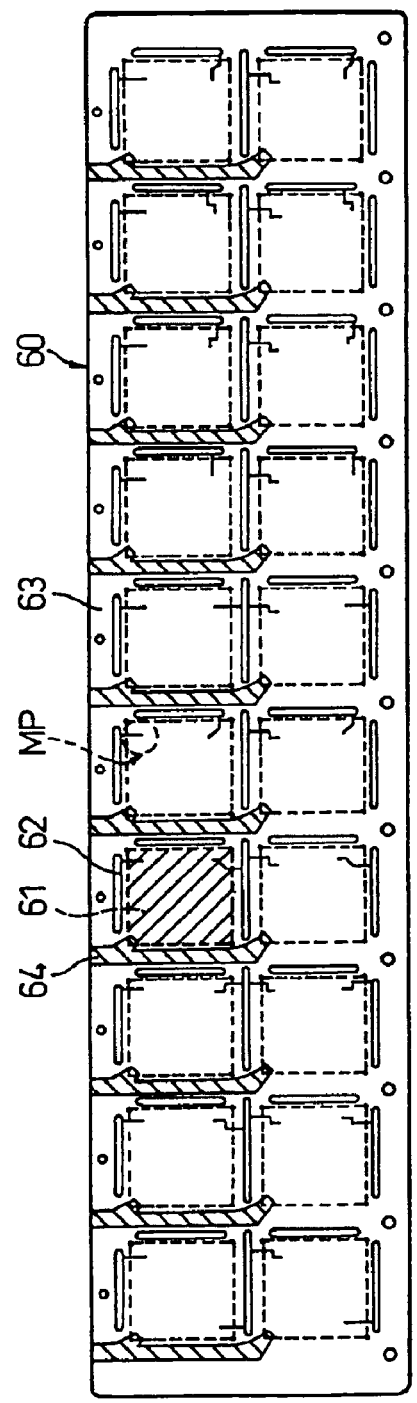

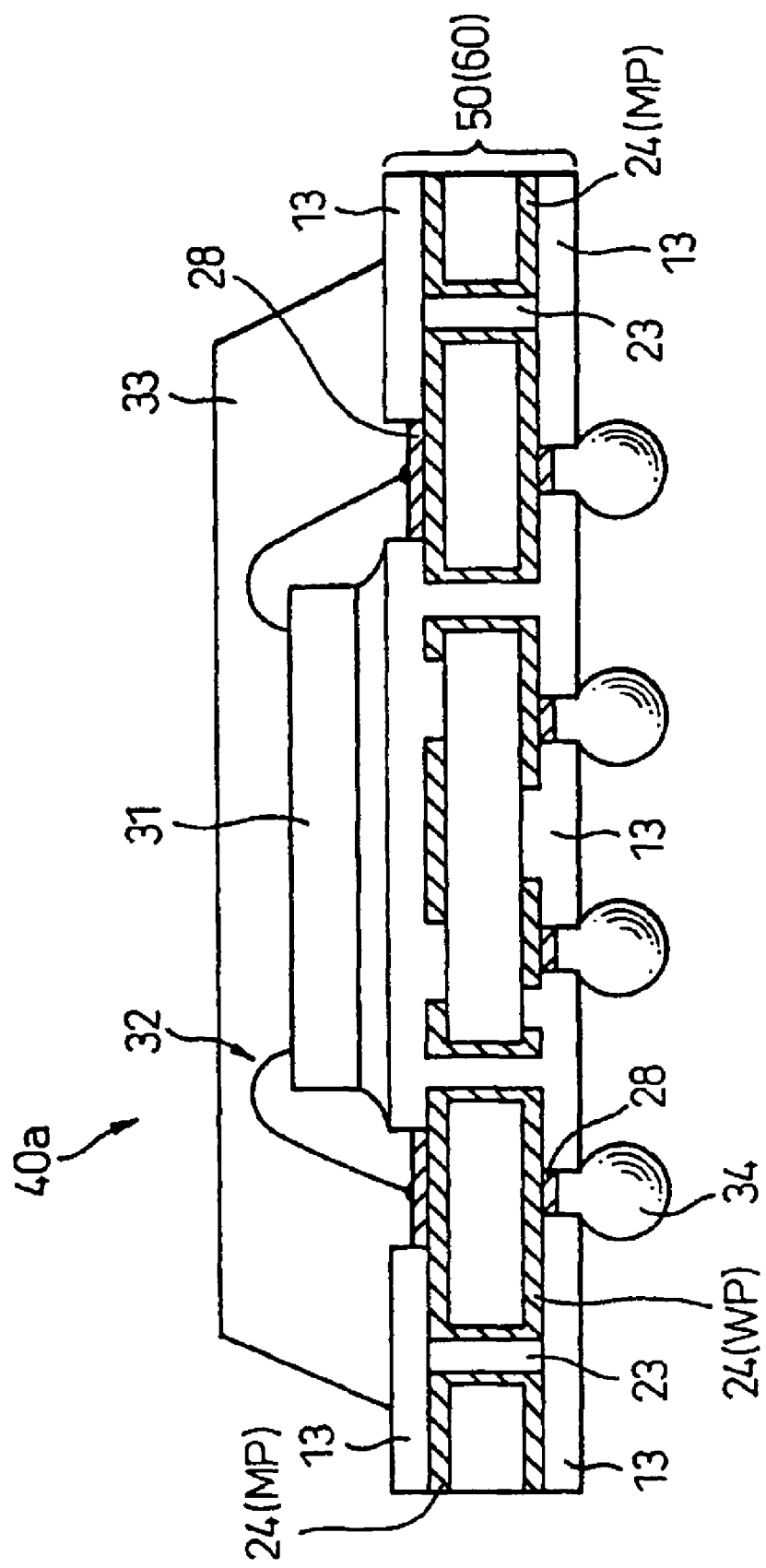

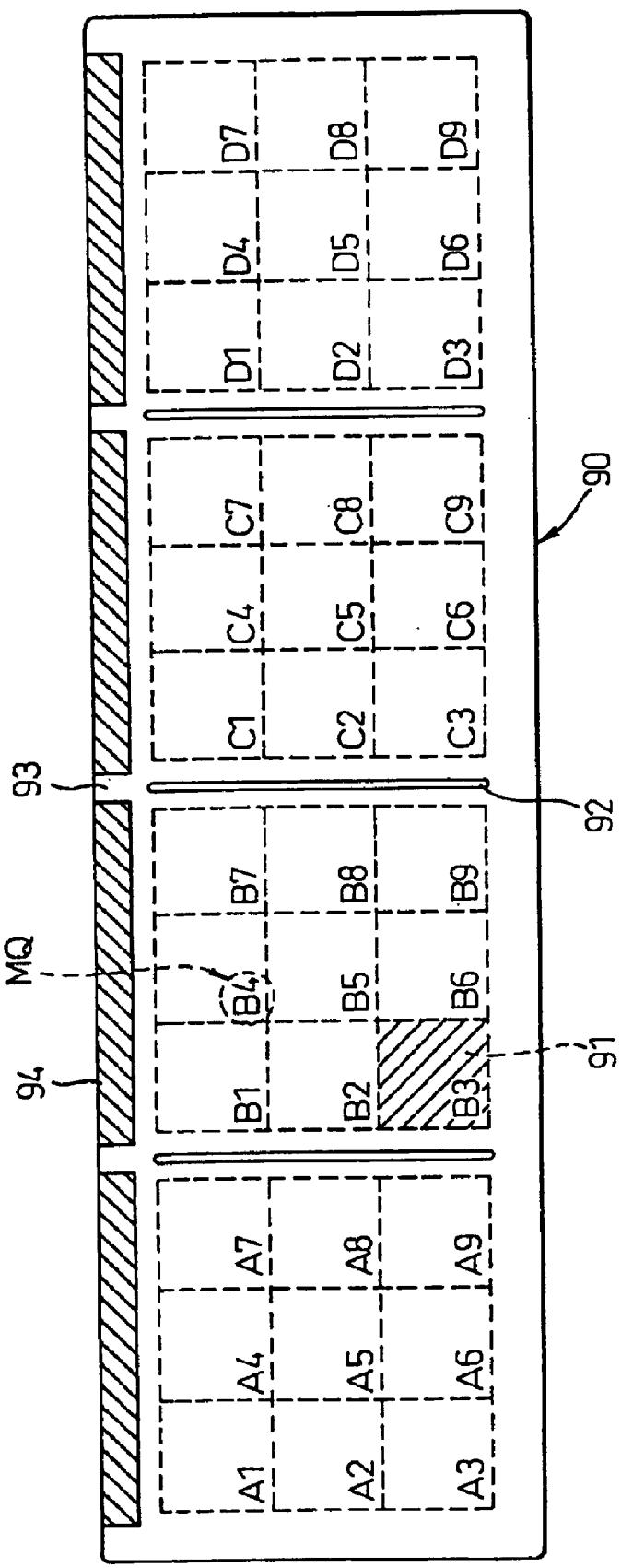

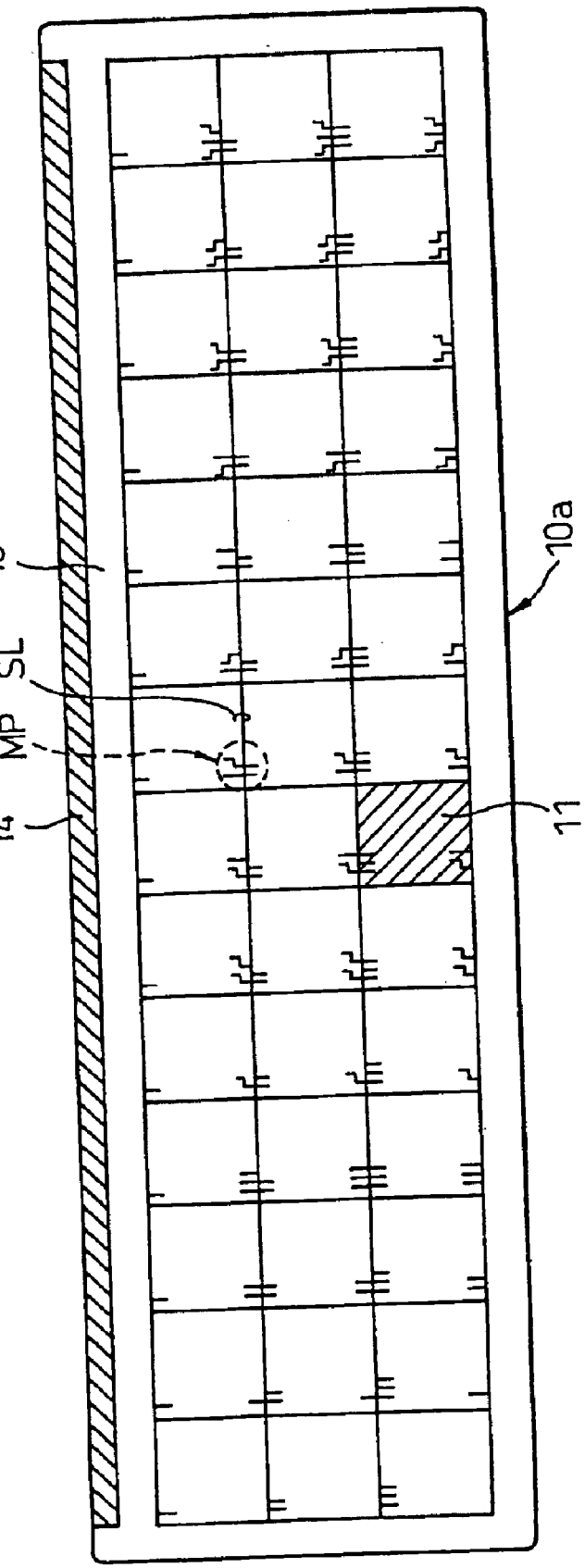

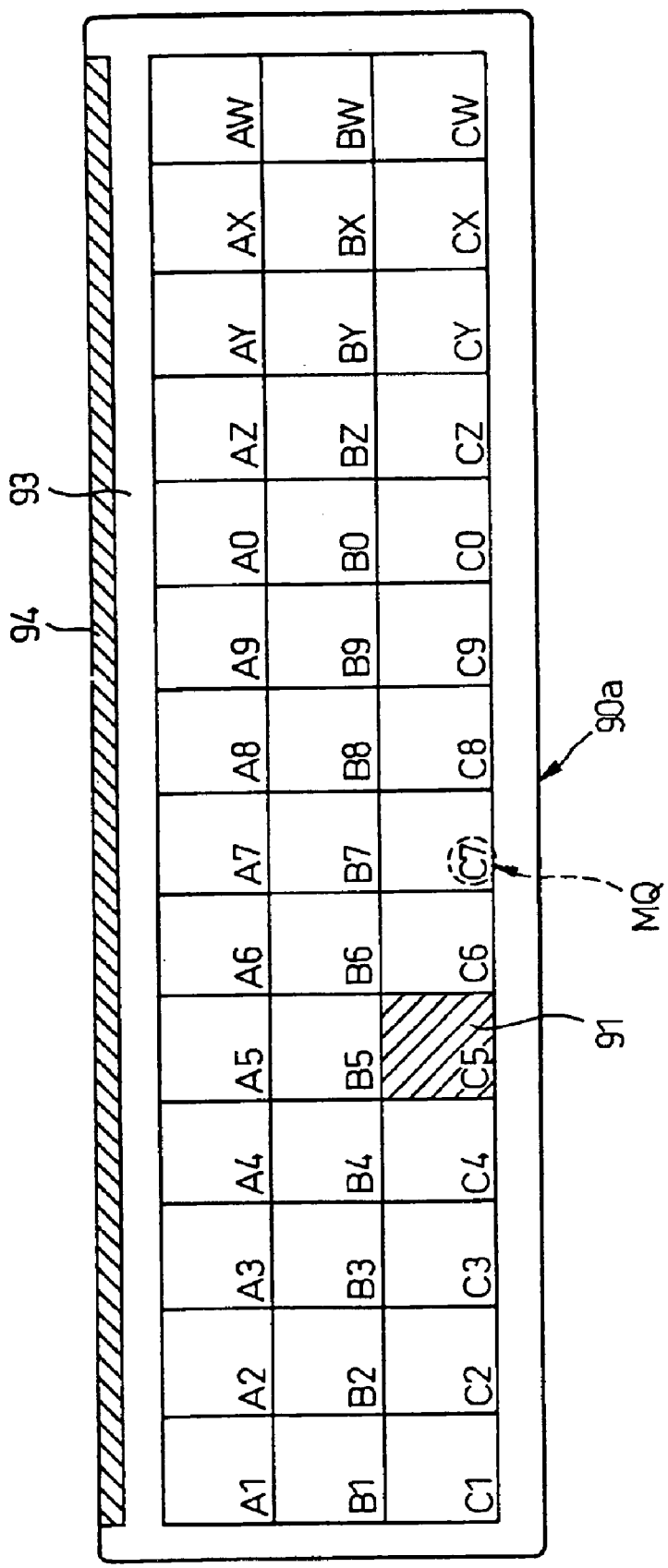

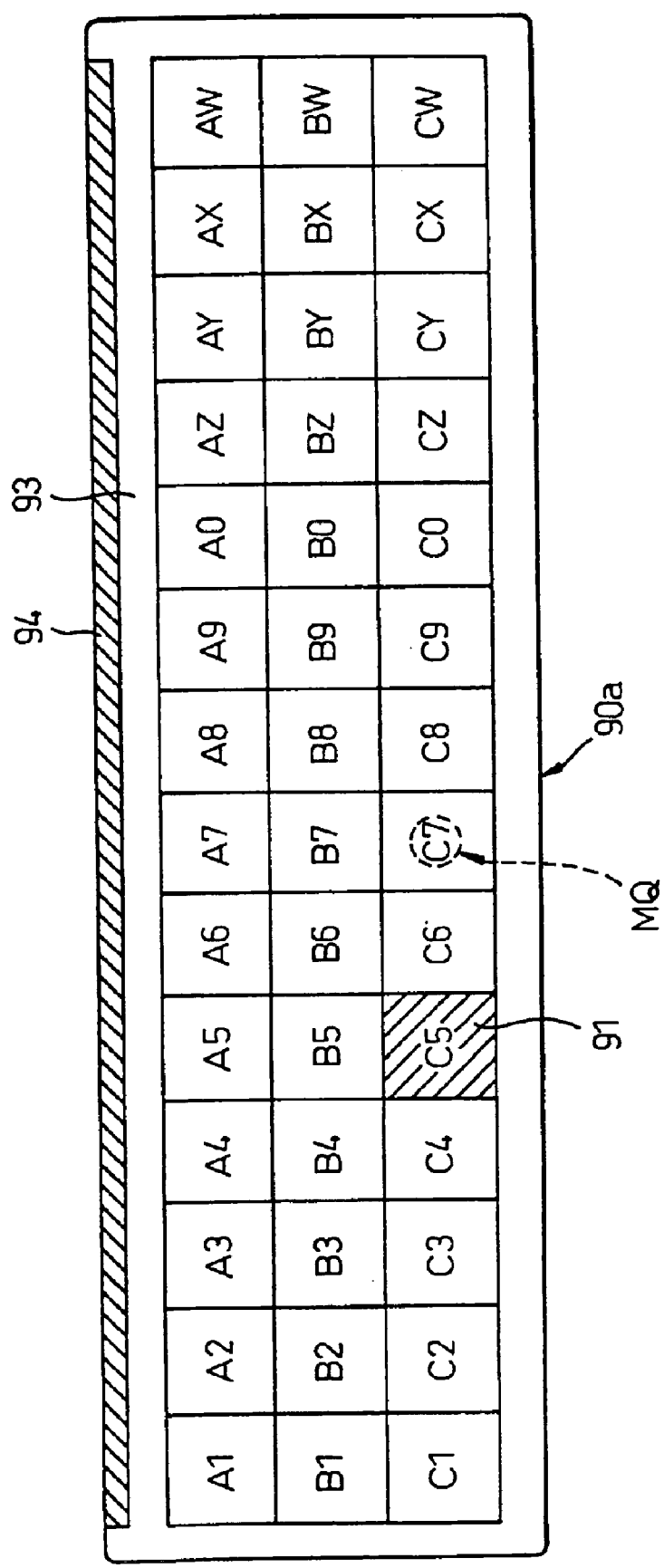

DISCONNECT POWER LINE FOR PLATING FROM SIGNAL LINE

DISCONNECT POWER LINE FOR PLATING FROM SIGNAL LINE

DISCONNECT POWER LINE FOR PLATING FROM SIGNAL LINE

DISCONNECT POWER LINE FOR PLATING FROM SIGNAL LINE

DISCONNECT POWER LINE FOR PLATING FROM SIGNAL LINE

DISCONNECT POWER LINE FOR PLATING FROM SIGNAL LINE

DISCONNECT POWER LINE FOR PLATING FROM SIGNAL LINE

WIRING SUBSTRATE HAVING POSITION INFORMATION

This application is a division of application Ser. No. 10/179,981, filed Jun. 26, 2002.

BACKGROUND OF THE INVENTION

1. Field of the Invention

The present invention generally relates to a manufacturing technique for a wiring substrate on which a semiconductor chip is mounted. Particularly, this invention relates to "semiconductor-chip-mounting" wiring substrate having position information and a semiconductor device using the same wherein failure analysis can be effectively conducted when a defect occurs in the wiring substrate or the semiconductor device using the same. This invention also relates to a process for manufacturing such a semiconductor-chip-mounting wiring substrate and a semiconductor device using the same.

2. Description of the Related Art

Recently, there has been a demand for reducing the weight and thickness of a wiring substrate so that a BGA (Ball Grid Array) semiconductor chip, the size of which is reduced and the number of pins of which is increased, can be mounted on the wiring substrate. Therefore, a plastic type wiring substrate, in which glass-epoxy resin composite boards are laminated, is widely used for the wiring substrate. This plastic type wiring board is typically manufactured as follows. A resin board (glass-epoxy resin composite board), on one face or both faces of which copper foil is stuck, is subjected to resist coating and etching so that a copper wiring pattern is formed on the board. Alternatively, through-holes are formed on a resin board and copper plating is conducted on the inner wall faces of the through-holes. Such resin boards are laminated with epoxy adhesive to obtain a plastic type wiring board. A predetermined number of semiconductor chips are mounted on the thus made wiring substrate. In this way, a semiconductor device is manufactured.

In general, the manufacturing process of this semiconductor device includes: a process of die attaching for mounting semiconductor chips on the substrate; a process of wire bonding for electrically connecting electrodes of each semiconductor chip with a wiring pattern on the substrate; a process of molding for sealing the semiconductor chips and wires with sealing resin; a process of ball mounting for connecting external connecting terminals such as solder balls with a substrate face on a side opposite to the side on which the semiconductor chips are mounted; and a cutting process for cutting the substrate into packages (semiconductor device). Concerning the method of molding, there are provided an individual molding in which molding is conducted for each semiconductor chip and a batch type molding in which molding is conducted for a plurality of semiconductor chips all at once. Recently, there is a tendency toward the batch type molding from the viewpoint of enhancing the efficiency of assembling a package.

If the semiconductor device manufactured by this manufacturing process is evaluated, its performance, price and reliability are important factors. Because the semiconductor device has been highly integrated and further the manufacturing device has been highly developed recently, the performance of the semiconductor device is greatly enhanced and the price is greatly reduced. Since the performance and price are stabilized as described above, in order to enhance the reliability, it is very important to quickly conduct failure analysis at a high technical level.

According to the prior art, for example, failure analysis is conducted as follows. After the electrical characteristic evaluation is completed for each semiconductor device which has already been subjected to the diffusion process at the wafer level, each semiconductor device is sorted so as to determine whether it is a non-defective product or it is a defective product. When a defective product is found, it is subjected to the failure analysis, so that the cause of the failure can be found. On the other hand, a non-defective product is subjected to mounting, and a delivery inspection is made to find whether it is a non-defective product or it is a defective product. When the semiconductor device is a non-defective product, it is delivered to the market. When the semiconductor device is a defective product, failure analysis is conducted in the same manner as that described before, so that the cause of the failure can be found. Further, when the non-defective product (semiconductor device), which has already been delivered to the market, becomes defective, the defective semiconductor device is recalled and subjected to failure analysis in the same manner so as to find the cause of the failure.

However, the following problems may be encountered in the aforementioned conventional method of failure analysis for analyzing a failure of a semiconductor device. In the case where a problem is found in a semiconductor device by a delivery inspection conducted after the product has been assembled (after it has been divided into each package), it is impossible to clearly specify a position of the semiconductor device at which the package (semiconductor device) was located on a sheet which is a state of the wiring substrate before it was divided into each package. Specifically, it is impossible to clearly judge whether the problems were caused at the specific position on the wiring substrate or the problems were caused in a specific process in the manufacturing process.

In order to make sure where each package was located when it was in a sheet state, it was necessary to make a reproducing experiment in such a manner that marking such as scratching, was manually conducted in the sheet state so that each package position can be specified after the completion of assembling a product.

However, this work is very complicated and takes a long time. Therefore, from the viewpoint of enhancing the efficiency of a failure analysis, it is not necessarily preferable to conduct marking and make such a reproducing experiment. Further, even if the above reproducing experiment is made, it is sometimes difficult to make sure of the position of each package.

As described above, according to the prior art, in the case where some problems occur in the delivery inspection, it is not always possible to clearly specify the position of each package (semiconductor device) when it was in a sheet state. Therefore, it was impossible to quickly feed back the result of the failure analysis to the manufacturing process. Accordingly, it was impossible to enhance the efficiency of the failure analysis. The above problems may also occur in the case where a semiconductor device, which was once delivered to the market, becomes defective.

In order to solve the above problems, it is possible to take a countermeasure in which a piece of characteristic information is given to each semiconductor chip in the manufacturing process. An example of this countermeasure is disclosed in Japanese Unexamined Patent Publication No. (JP-A) 5-129384. According to the above patent publication, numerals or marks representing a piece of chip attribute information, which represents a position on a wafer at which the chip was located in the manufacturing process, are written in the periphery of a semiconductor element mounting region on the wafer, which is a region finally cut off as an individual semiconductor chip, except for a region in which the semiconductor circuit is formed.

However, according to the above technique described in JP-A 5-129384, since the chip attribute information is composed of numerals or marks which are combined with each other, it is necessary to provide a region on the wafer in which the chip attribute information is written. Since the space on the wafer is limited, it is difficult to write the chip attribute information on the wafer. Further, this technique disclosed in JP-A 5-129384 is provided for discriminating not a package substrate but a wafer.

Separately from the technique disclosed in the above patent publication, it is possible to consider a technique in which the same chip attribute information is written on the connecting ball joining face of the wafer which is opposite to the side on which the chip is mounted.

However, according to this method, there will be a case in which it is impossible to write the chip attribute information because the space is limited depending upon an arrangement and an arrangement pitch of external terminals (solder balls) to be joined since a demand for reducing the size and increasing the number of pins is strong.

SUMMARY OF THE INVENTION

The present invention has been developed to solve the above problems of the prior art.

It is an object of the present invention to provide a wiring substrate having positional information, a method of manufacturing the wiring substrate and a method of manufacturing a semiconductor device characterized in that the results of a failure analysis can be quickly fed back to the manufacturing process so that the efficiency of failure analysis can be enhanced.

According to the present invention, there is provided a wiring board for a semiconductor package comprising: a base substrate having first and second surfaces; a wiring layer consisting of necessary wiring patterns formed on at least one of the first and second surfaces; a plurality of semiconductor element mounting areas formed on the surface of the base substrate on which the wiring layer is formed; and individual patterns, as position information, provided for the respective semiconductor element mounting areas, the individual patterns having a particular shape for the respective semiconductor element mounting area.

The base substrate is made of resin, such as BT resin, epoxy resin, or polyimide resin, or ceramic, on which metal patterns as position information can be formed. The individual patterns as position information may be formed on peripheral regions of the respective semiconductor element mounting areas. The individual patterns as position information may be formed as parts of the wiring patterns of the wiring layer.

The individual patterns, as position information of the wiring layer, may be exposed outside. Otherwise, the individual patterns as position information of the wiring layer may be covered with a protective layer.

The individual patterns, as position information, may be plating leader lines which can be used as wiring when an electrolytic plating is conducted. The individual patterns as position information may include letters, characters or the like.

According to another aspect of the present invention, there is provided a wiring board for a semiconductor package comprising: a base substrate having first and second surfaces; at least two wiring layers providing with respective wiring patterns formed on at least one of the first and second surfaces via respective insulating layers; a plurality of semiconductor element mounting areas defined in any one of the inner wiring layers; and individual patterns, as position information, provided for the respective semiconductor element mounting areas, the individual patterns having a particular shape for the respective semiconductor element mounting area.

According to still another aspect of the present invention, there is provided a wiring board for a semiconductor package comprising: a base substrate having first and second surfaces; at least two wiring layers providing with respective wiring patterns formed on at least one of the first and second surfaces via respective insulating layers; a plurality of semiconductor element mounting areas defined in the uppermost wiring layers; and individual patterns, as position information, provided for the respective semiconductor element mounting areas, the individual patterns having a particular shape for the respective semiconductor element mounting area.

According to further aspect of the present invention, there is provided a process of manufacturing a wiring board of semiconductor package, the process comprising: forming a wiring layer consisting of necessary wiring patterns on at least one of the first and the second surfaces of a base substrate; and simultaneously forming individual patterns, as position information provided for respective semiconductor element mounting areas, on the surface of the base substrate on which the wiring layer is formed, the individual patterns having a particular shape for the respective semiconductor element mounting area.

According to still further aspect of the present invention, there is provided a process of manufacturing a semiconductor device using the wiring board as mentioned above.

BRIEF DESCRIPTION OF THE DRAWINGS

FIG. 1 is a plan view showing a model of a structure of a wiring substrate having positional information of the first embodiment of the present invention;

FIGS. 7(a) and 7(b) are plan views showing a model of a structure of a wiring substrate having positional information of the second embodiment of the present invention;

FIG. 8 is a sectional view showing a structure of a semiconductor device into which the wiring substrate shown in FIG. 7 is incorporated;

FIG. 11 is a plan view showing a model of a structure of a wiring substrate having positional information of the fourth-embodiment of the present invention;

FIG. 12 is a plan view showing a model of a structure of a wiring substrate having positional information of the fifth embodiment of the present invention;

FIGS. 13(a) and 13(b) are plan views showing a model of a structure of a wiring substrate having positional information of the sixth embodiment of the present invention;

DETAILED DESCRIPTION OF THE PREFERRED EMBODIMENTS

Figure 2A:
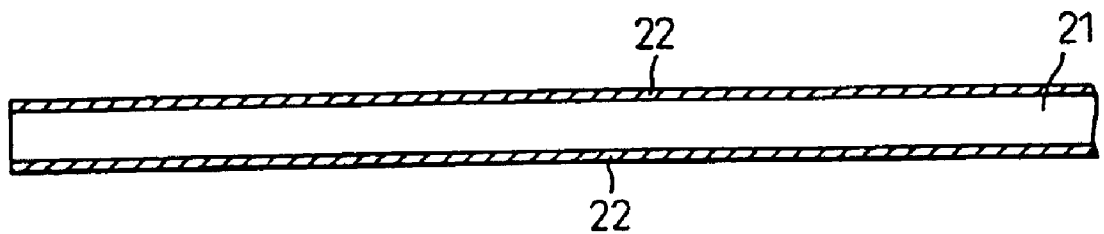
FIGS. 2(a) to 2(d), 3(a) to 3(d) and 4(a) to 4(d) are respectively sectional views showing a process of manufacturing the wiring substrate shown in FIG. 1.

FIG. 1 is an arrangement plan view showing a model of a wiring substrate having positional information of the first embodiment of the present invention.

In the example shown in the FIG. 1, the view is taken from a chip mounting side of the wiring substrate 10 having position information of the present embodiment. Reference numeral 11 shows a region, which will be referred to as "a semiconductor element mounting region" hereinafter, on which a semiconductor chip is mounted, which is cut off finally so that each semiconductor device (package) can be made. The semiconductor element mounting regions 11 are arranged into a matrix form of 3×3. Further, four groups of this matrix form are arranged, continuously in the longitudinal direction. Reference numeral 12 is a slit for separating the groups of this matrix form.

Reference numeral 13 is a solder resist layer which is used as a protective film (insulating layer) to cover a surface of the substrate 10, and reference numeral 14 is a mold gate which is used as a pouring port from which sealing resin is poured when the package is subjected to molding. This mold gate 14 is formed in such a manner that a predetermined portion of the solder resist layer 13 is removed as described later, that is, a predetermined portion in the cross section of the substrate 10 is opened. This mold gate 14 is defined by a region in which the solder resist layer 13 is not formed on the chip mounting side of the substrate 10. As shown in the drawing, the mold gate 14 is provided in a portion corresponding to each group of the matrix form regions (3×3). In the case of assembling a package, molding is conducted on the corresponding nine semiconductor chips from the mold gate 14 all at once.

Reference mark MP represents a plating leader line used as "positional information" which is an important element in the present invention. As shown in the drawing, the plating leader line, the profile of which is peculiar to itself, is arranged in the periphery of each semiconductor element mounting region 11. Plating leader line MP is used as a wire for electrolytic plating described later, which is formed simultaneously when predetermined wiring patterns are formed on both sides of the substrate. In this connection, in order to simplify the drawing, the wiring patterns are omitted in FIG. 1.

Reference mark SL represents a feeder, which electrically connects plating leader lines MP of the groups of the matrix form (3×3) with each other. Due to the above structure, it is possible to conduct electrolytic plating of Au on the bonding pads of the wiring pattern as described later. Feeder SL is formed simultaneously with plating leader line MP. Feeder SL is formed at a position in a substrate cutting portion where cutting is finally conducted when a package is assembled. Accordingly, when each semiconductor device is cut off, feeder SL is removed. Therefore, plating leader line MP of the semiconductor device concerned is electrically independent from the plating leader lines of other devices.

Next, explanations will be made into a method of manufacturing the wiring substrate 10 having positional information of the present embodiment. Referring to FIGS. 2(a)–2(d), 3(a)–3(d), and 4(a)–4(d) which are sectional views taken on line A–A' in FIG. 1 and in which the manufacturing processes are successively shown, the method will be explained below. In order to simplify the drawing, the double layer wiring structure is shown in the drawing.

First of all, in the first process shown in FIG. 2(a), there is prepared a core base plate 21 of the wiring substrate 10, on both faces of which pieces of copper (Cu) foil 22 are attached. For example, glass cloth, which is used as base material, is impregnated with organic resin such as BT resin, epoxy resin or polyimide resin, so that the core base plate 21 is composed. On both faces of the core base plate 21, pieces of copper (Cu) foil 22 are laminated and bonded. In this way, "the glass cloth base material copper covered laminated plate" is prepared.

Instead of the base plate on which glass cloth is used as base material, a tape (TAB) base plate made of polyimide resin may be used as base material.

Figure 2B:
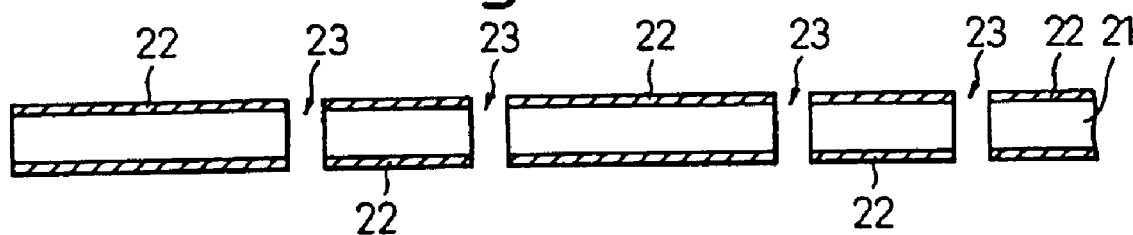

In the next process shown in FIG. 2(b), at predetermined positions on the copper covered laminated plate 21 (22), through-holes 23 are formed, for example, by means of a mechanical drill. In this case, depending upon the diameter of the through-hole 23 to be formed, instead of using the mechanical drill, it is possible to use $CO_2$ laser beams or excimer laser beams to form the predetermined holes.

Figure 2C:
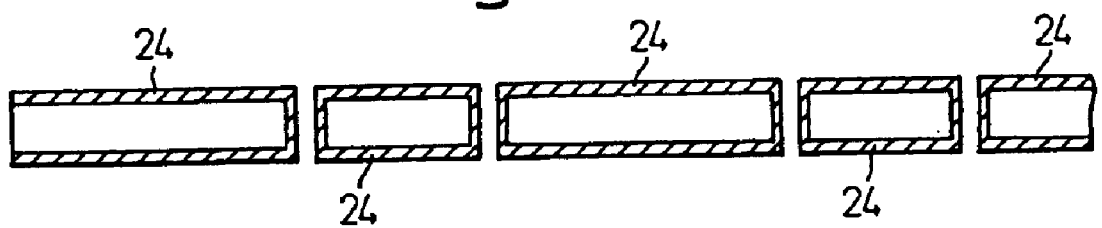

In the next process shown in FIG. 2(c), the conductive layer 24 of Cu is formed on the entire face of the copper covered lamination layer 21 (22) including the inner walls of the through-holes 23. This conductive layer 24 is formed in such a manner that, for example, after a thin-film-shaped Cu layer has been formed on the entire face by means of electroless plating of Cu, this thin-film-shaped Cu layer is used as a feeder layer, and a Cu layer is further laminated on the thin-film-shaped Cu layer by means of electrolytic plating of Cu.

Figure 2D:
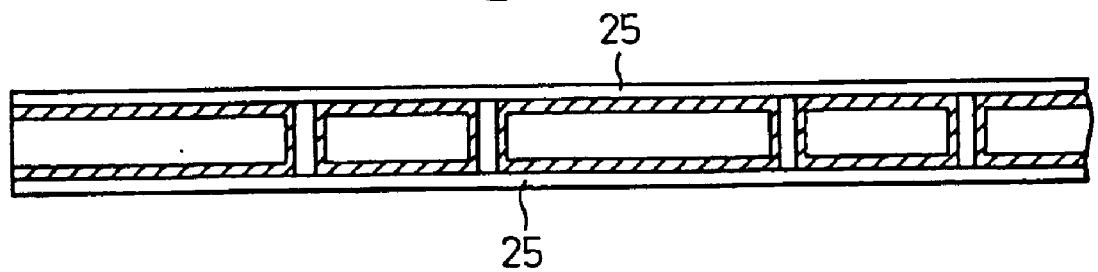

In the next process shown in FIG. 2(d), the photosensitive dry films 25, which are used as etching resist, are thermally stuck with pressure onto both faces of the copper covered laminated plate 21 (22) on which the conductive layers (Cu layer) 24 are formed.

Figure 3A:
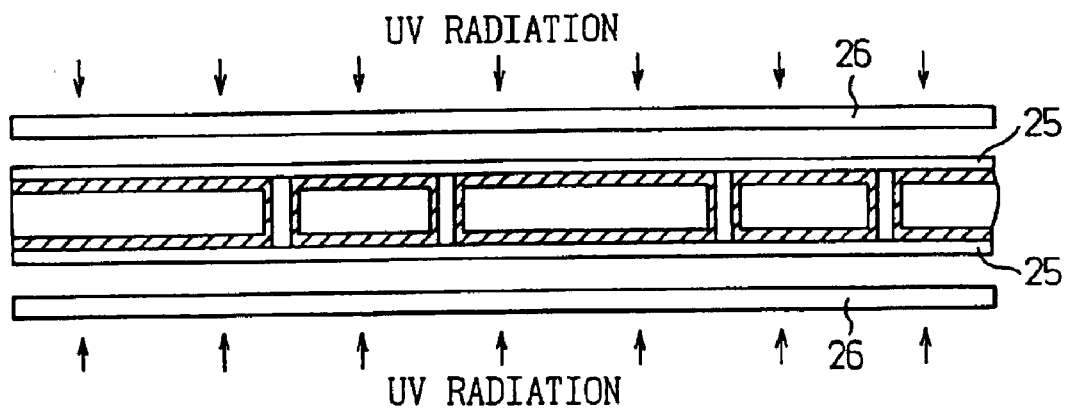

In the next process shown in FIG. 3(a), the dry films 25 provided on both sides are exposed to light by using the masks 26 which have been previously patterned according to a predetermined wiring pattern and a predetermined profile of plating leader line MP including feeder SL. That is, each mask 26 is positioned on each dry film 25, and ultraviolet rays (UV) are irradiated to each mask 26 from an upper and a lower portion of the mark.

Figure 3B:
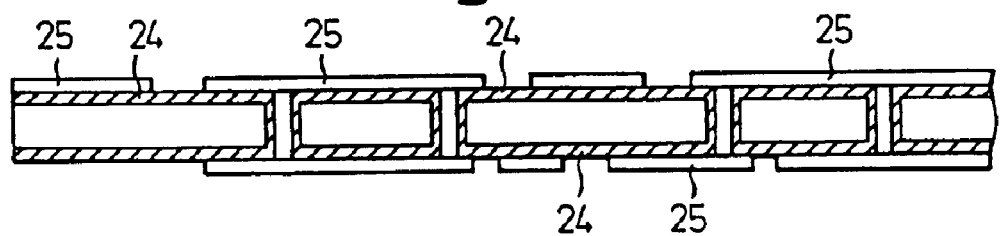

In the next process shown in FIG. 3(b), the dry films 25 on both sides are subjected to development, so that patterning is conducted on each dry film. This development is conducted as follows. In the case where the dry film 25 is a negative type resist, development is conducted with a developing solution containing an organic solvent. In the case where the dry film 25 is a positive type resist, development is conducted with an alkali developing solution. In the example shown in the drawing, the negative type resist is used. Therefore, a portion (exposed portion) of each dry film 25, which has been irradiated with UV, is left.

Figure 3C:
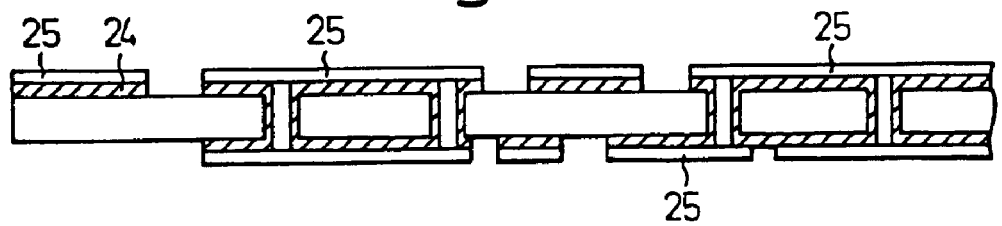

In the next process shown in FIG. 3(c), for example, wet etching is conducted while each patterned dry film 25 is being used as a mask (In this case, a solution in which Cu is soluble is used for wet etching.), so that the Cu layer 24 (Although not shown in the drawing, the lower Cu foil 22 is included.) in the exposed portion is removed.

Figure 3D:
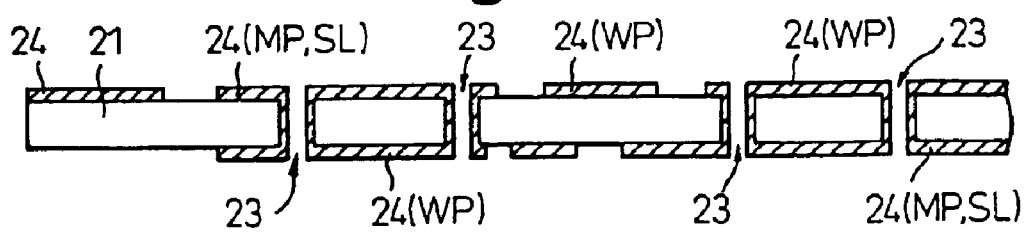

In the next process shown in FIG. 3(d), the dry film 25 is peeled and removed. Due to the foregoing, the predetermined wiring pattern WP, which is composed of a portion of the conductor layer (Cu layer) 24, and plating leader line MP (including feeder SL) are formed on both sides of the core substrate 21.

Figure 4A:
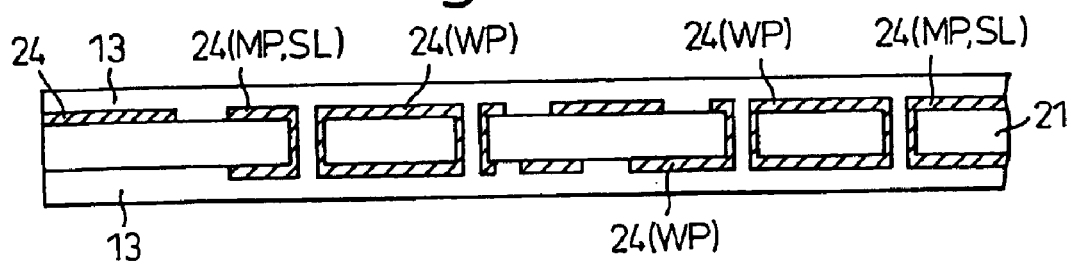

In the next process shown in FIG. 4(a), on both sides of the core substrate 21 on which the conductive layer 24 (wiring pattern WP, plating leader line MP and feeder SL) is formed, a photosensitive resist is coated, for example, by means of screen printing (Formation of the solder resist layer 13).

Figure 4B:
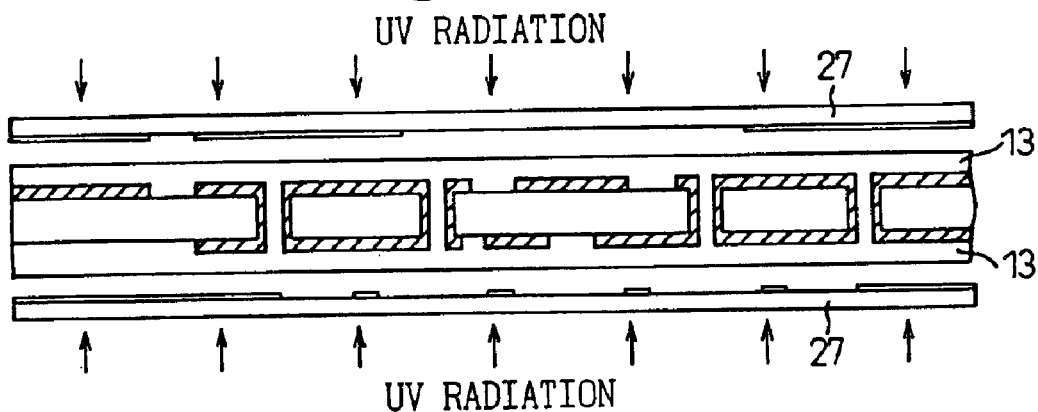

In the next process shown in FIG. 4(b), the solder resist layers 13 on both faces are exposed to light while the masks 27, which are respectively patterned by a predetermined profile, are being used. That is, each mask 27 is positioned on each solder resist layer 13, and ultraviolet rays (UV) are irradiated from an upper and a lower portion of each mask 27 as shown by arrows in the drawing.

Each mask 27 used in this process is subjected to patterning according to the profile of a predetermined electrode pad together with the profiles of the above wiring pattern WP, plating leader line MP and feeder SL. Further, concerning the mask 27 on the chip mounting side, patterning is conducted according to the profile of the mold gate 14 shown in FIG. 1.

Figure 4C:
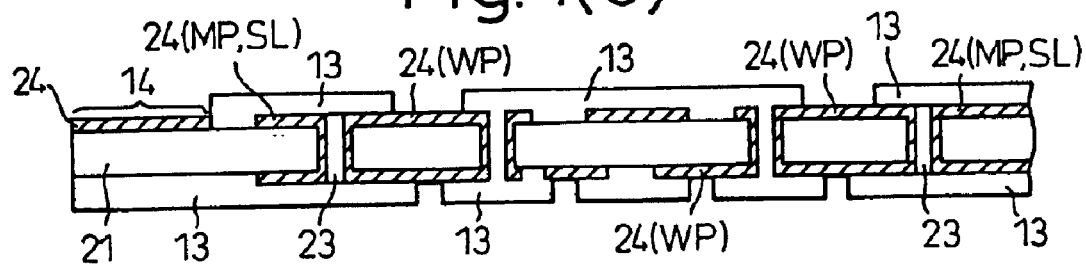

In the next process shown in FIG. 4(c), each solder resist layer 13 is developed, and patterning is conducted according to the above predetermined profile. This is conducted in the same manner as that shown in FIG. 3(b), that is, developing is conducted with a developing solution containing an organic solvent (in the case of a negative resist type), or developing is conducted with a developing solution containing an alkali solvent (in the case of a positive resist type). In the example shown in the drawing, a case of the negative resist type is shown. Therefore, a portion of each solder resist layer 13, which has been exposed to UV, is left.

In this case, portions, in which the solder resist layer 13 has been removed and the conductive layer (Cu layer) 24 has been exposed, compose the above wiring pattern WP, plating leader line MP and feeder SL and also compose a pad with which a bonding wire connected with an electrode of the semiconductor chip is connected and a pad connected with a solder ball (external connecting terminal). A portion from which the solder resist layer 13 has been removed on the chip mounting side composes the mold gate 14.

Figure 4D:
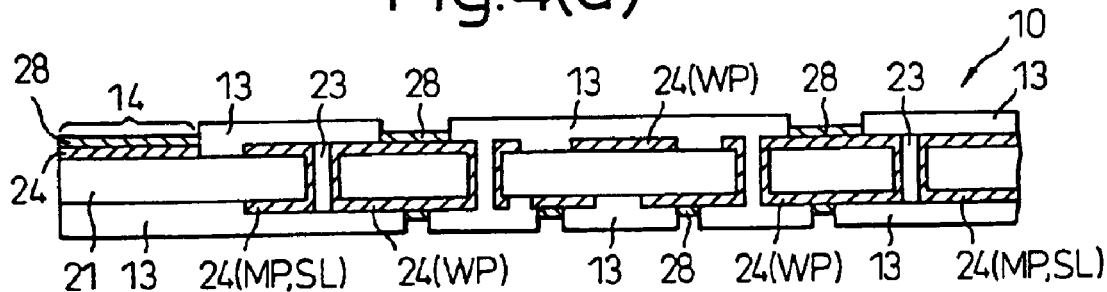

In the final process shown in FIG. 4(d), the conductive layers (Cu layer) 24 respectively exposed from solder resist layers 13 on both sides are subjected to electrolytic plating of nickel (Ni) while each conductive layer (Cu layer) 24 is being used as a feeder layer. Further, electrolytic plating of Au is conducted, so that the conductive layers (Ni/Au layer) 28 are respectively formed. These Ni/Au layers are formed so that the adhesion property can be enhanced when bonding wires are connected at the latter stage and also the adhesion property can be enhanced when solder balls are connected at the latter stage.

According to the above processes shown in FIGS. 2(a) to 4(d), the wiring substrate 10 having positional information of the present embodiment is manufactured.

Next, the semiconductor device into which the wiring substrate 10 having positional information of the present embodiment is incorporated will be explained below referring to FIGS. 5(a)–5(c) in which the manufacturing processes are shown.

Figure 5A:
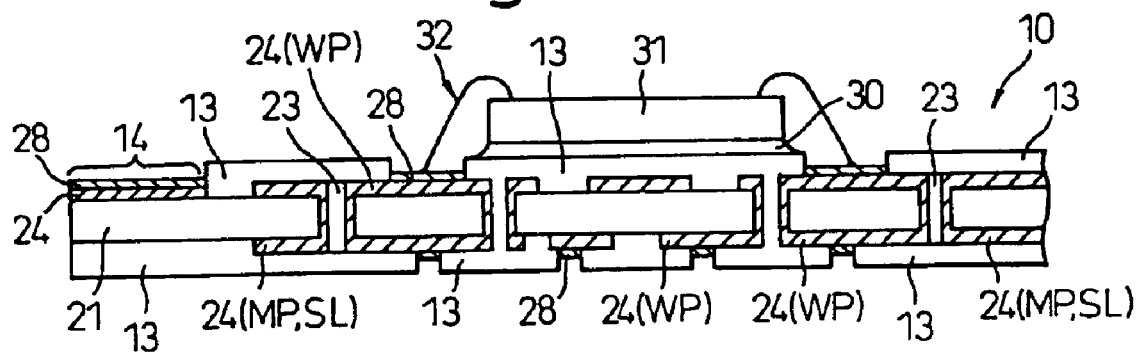
FIGS. 5(a) to 5(c) are sectional views showing a process of manufacturing a semiconductor device into which the wiring substrate shown in FIG. 1 is incorporated.

First of all, in the first process shown in FIG. 5(a), die attaching and wire bonding are conducted.

That is, the adhesive 30 made of epoxy resin is coated in the chip (or die) mounting region on the solder resist layer 13 on the wiring substrate 10. Then, while a reverse side of the semiconductor chip 31 to be mounted is set downward, that is, while a face opposite to the side on which the electrode is formed is set downward, the semiconductor chip 31 is made to adhere to the chip mounting region with the adhesive 30 (die attaching).

Next, the semiconductor chip 31 and the Cu layer 24 are electrically connected with each other by the bonding wire 32 made of Au through the pad exposed from the solder resist layer 13, that is, through the Ni/Au layer 28 (wire bonding).

In this connection, in the example shown in FIG. 5(a), only one semiconductor chip 31 is mounted so as to simplify the explanation, however, a plurality of semiconductor chips 31 are mounted in the actual structure.

Figure 5B:
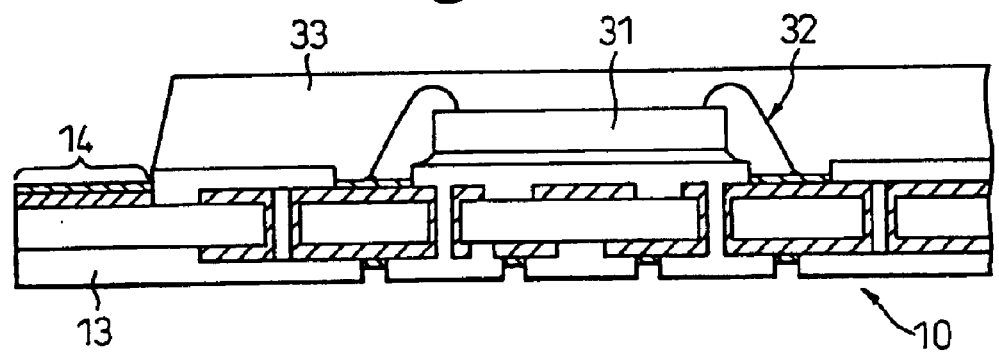

In the next process shown in FIG. 5(b), the semiconductor chip 31 and the bonding wire 32 are sealed with the sealing resin 33 by the batch type molding system. This sealing work is conducted in such a manner that while a molding metallic die (not shown) having a recess corresponding to the final profile of the sealing resin 33 is used and the sealing resin is being poured into the recess from the mold gate 14, heat and pressure are given. In this process, the batch type molding system is used, however, of course, the individual molding system may be used.

Figure 5C:
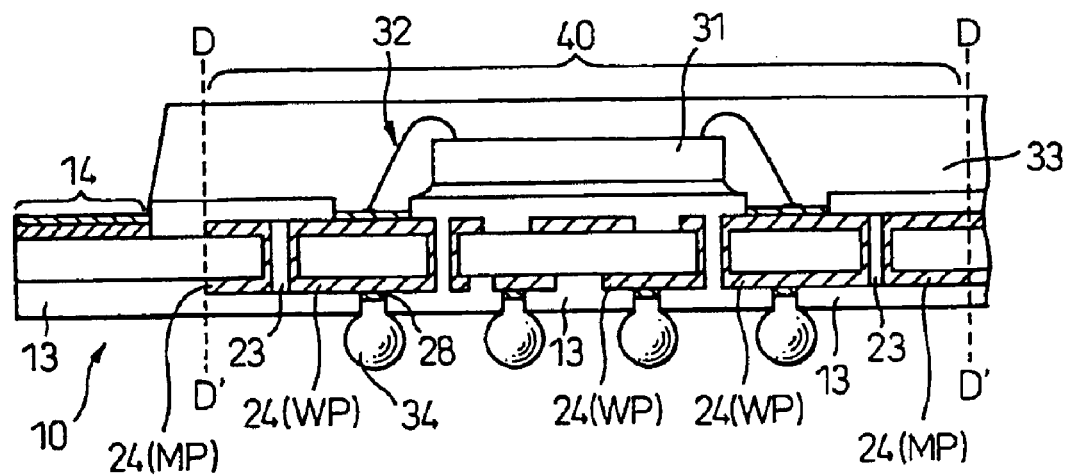

In the final process shown in FIG. 5(c), ball mounting and cutting are conducted.

That is, the solder balls 34 are put on the Cu layer 24 via the pads exposed from the solder resist layer 13 on the side opposite to the chip mounting side, that is, via the Ni/Au layer 28, and reflowing is conducted so that the solder balls 34 are joined to the pads concerned (ball mounting). Due to the foregoing, the solder balls 34 can be electrically connected with the semiconductor chips 31 from the pads concerned via the Cu layers formed on the inner walls of the through-holes 23, wiring patterns WP on the chip mounting side and bonding wires 32.

Next, the wiring substrate 10 having positional information is divided by a dicer into each package together with the sealing resin 33 on broken line D–D', so that the semiconductor device 40 is obtained (cutting). As described before, feeder SL (a portion of the Cu layer 24) is removed at this time, and plating leader line MP (a portion of the Cu layer 24) of the semiconductor device 40 is electrically separated from the plating leader lines of other devices.

Figure 6A:
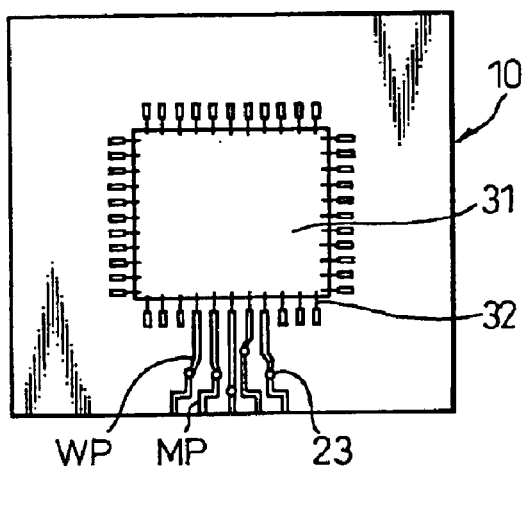
FIGS. 6(a) to 6(c) are plan views showing a model of an example of a structure of a semiconductor device composed of the wiring substrate shown in FIG. 1.
Figure 6B:
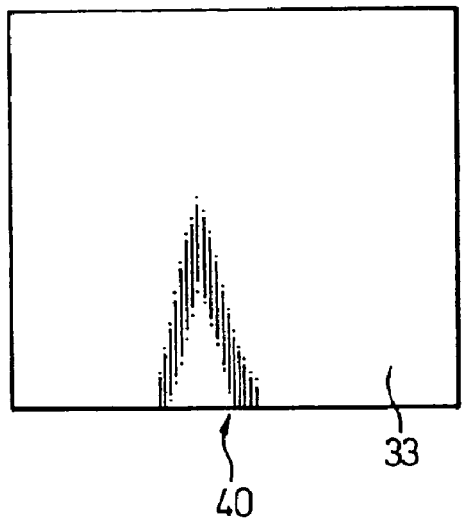
Figure 6C:
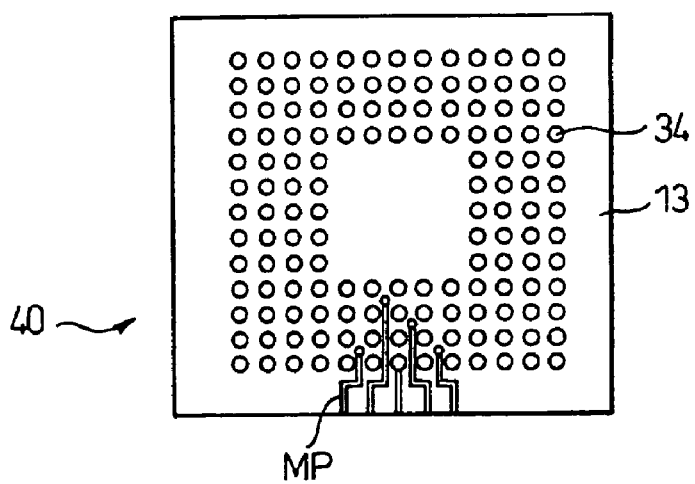

FIGS. 6(a)–6(c) are plan views showing an arrangement of an example of a semiconductor device manufactured in the processes shown in FIGS. 2(a) to 5(c), that is, an example of a semiconductor device into which the wiring substrate 10 having positional information shown in FIG. 1 is incorporated.

FIG. 6(a) is a plan view of the semiconductor device before resin sealing is conducted, wherein the semiconductor device is viewed from a face on which the chip is mounted, and corresponds to an arrangement which is viewed from an upper portion of the substrate in the process shown in FIG. 5(a). FIG. 6(b) is a plan view of the semiconductor device after resin sealing is conducted, wherein the semiconductor device is viewed from a face on which the chip is mounted. FIG. 6(c) is a plan view of the semiconductor device, wherein the semiconductor device is viewed from a face on which the balls are mounted. These drawings respectively correspond to arrangements which are viewed from an upper and a lower portion of the substrate in the process shown in FIG. 5(c), however, as long as the number of the solder balls 34 is concerned, these drawings do not necessarily correspond to them.

As shown in the drawings, concerning the side of the substrate on which the solder balls 34 are joined, with respect to plating leader line MP used as "positional information", which is a part of the present invention, "positional information" is exposed outside through an insulating film such a the solder resist layer 13. However, concerning the side of the substrate on which the semiconductor chip 31 is mounted, since the entire face is covered with the sealing resin 33, "positional information" is not exposed outside.

As explained above, according to the wiring substrate 10 (including the semiconductor device 40 into which the substrate is incorporated) having positional information relating to the first embodiment and the method of manufacturing the wiring substrate 10, plating leader line MP is formed into a shape peculiar to each region in the periphery of each semiconductor element mounting region 11, as shown in FIG. 1, which is a region on which the semiconductor chip 31 is finally mounted and this region is cut off as an individual semiconductor device 40. This peculiar plating leader line MP is used as positional information to specify a position of each semiconductor element mounting region 11 on the wiring substrate 10.

Accordingly, concerning the semiconductor device 40, in the case where a breakdown is found in the delivery inspection conducted after the product has been assembled, or alternatively, in the case where a breakdown is found after the product has been delivered, it is possible to visually obtain a piece of peculiar positional information given to the semiconductor device 40 in the case of a failure analysis. In the example shown in FIG. 6, it is possible to visually obtain a piece of peculiar positional information given to the semiconductor device 40 from the side on which the balls are joined. Therefore, it is possible to clearly specify a position at which the semiconductor device 40 concerned is located when it is in a sheet state, which is a state in which the wiring substrate 10 is put before it is divided into each package.

Due to the foregoing, it is possible to clearly judge whether the breakdown was caused by a specific position on the wiring substrate where the semiconductor device is located or the breakdown was caused by a specific process in the manufacturing process. It is possible to quickly feed back the result of a failure analysis to the manufacturing process. Therefore, the efficiency of failure analysis can be highly enhanced. Further, unlike the prior art, it becomes unnecessary to manually conduct marking such as scratching or make an experiment of reproducibility. Therefore, failure analysis can be executed more effectively.

In the above first embodiment, explanations are made of an example in which the mold gate sections 14 are arranged being formed into a belt-shape along the periphery of the wiring substrate 10 having positional information. However, it should be noted that the arranging form of the mold gate sections 14 is not limited to the above specific example. An example of the arranging form of the mold gate sections 14 is shown in FIGS. 7(a) and 7(b).

FIGS. 7(a) and 7(b) are plan views showing an arrangement of a wiring substrate having positional information of the second embodiment of the present invention. In the same manner as that shown in FIG. 1 relating to the first embodiment, a wiring substrate 50 shown in FIG. 7(a) and a wiring substrate 60 shown in FIG. 7(b) having positional information are viewed from the side on which the chips are mounted.

In the drawings, reference numerals 51 and 61 are regions in which the semiconductor elements are mounted, reference numerals 52 and 62 are slits, reference numerals 53 and 63 are solder resist layers which are protective films (insulating layers), and reference numerals 54 and 64 are mold gate sections. On the wiring substrate 50 having positional information, the mold gate section 54 is arranged corresponding to each semiconductor mounting region 51 by one to one. Therefore, when the package is assembled, molding is conducted on the one corresponding semiconductor chip. On the other hand, on the wiring substrate 60 having positional information, the mold gate sections 64 are arranged being formed into a belt-shape corresponding to groups of the matrix-shaped (1×2) regions. When the package is assembled, molding is conducted from each mold gate section 64 to the two corresponding semiconductor chips simultaneously and individually. In this connection, portions indicated by dotted lines represent cutting lines of the substrate.

Reference mark MP is a plating leader line used as "positional information" which is a characteristic of the present invention. In the same manner as that of the first embodiment shown in FIG. 1, the plating leader line is formed into a peculiar profile in the periphery of each semiconductor element mounting region 51, 61.

Although feeder SL shown in FIG. 1 is not shown in the case shown in FIG. 7, in the same manner as that of the first embodiment, the feeder is provided together with plating leader line MP until the stage before electrolytic plating of Au is conducted on the bonding pads of the wiring pattern. That is, in this second embodiment, after electrolytic plating is conducted on the bonding pads of the wiring pattern, portions on the substrate in which the feeders are formed are punched out so that the slits 52, 62 are formed and individual plating leader lines MP are made to be electrically independent from each other.

FIG. 8 is a sectional view of an arrangement of a semiconductor device into which the wiring substrate 50, 60 having positional information shown in FIGS. 7(a) and 7(b) is incorporated. A different point of the semiconductor device 40a shown in the drawing from the semiconductor device 40 shown in FIG. 5(c) of the first embodiment is that the periphery on the chip mounting face side is not covered with the sealing resin 33. Since other points of the structure are the same, explanations are omitted here.

Figure 9A:
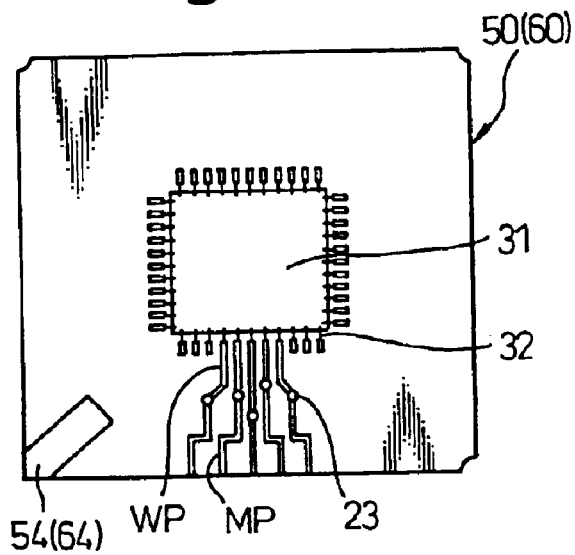
FIGS. 9(a) to 9(c) are plan views showing a model of an example of a structure of a semiconductor device composed of the wiring substrate shown in FIG. 7.
Figure 9B:
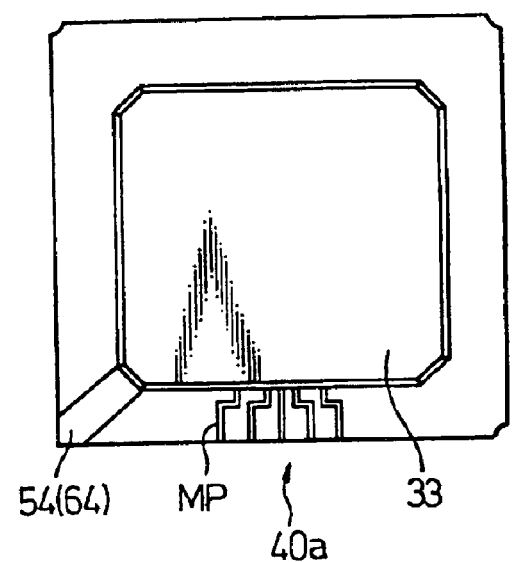
Figure 9C:
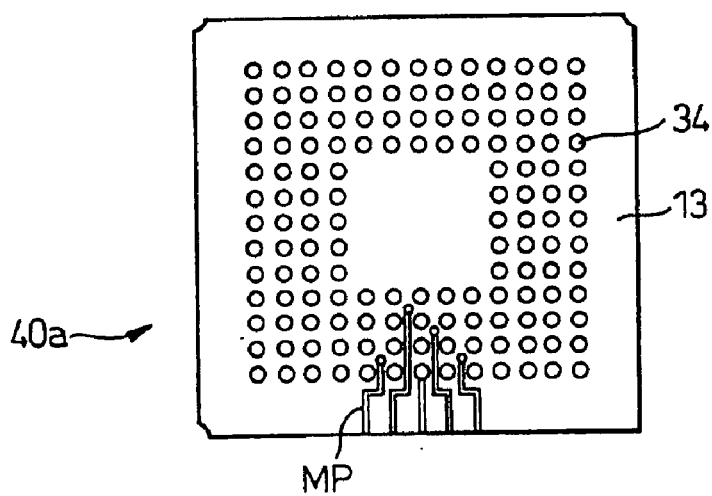

FIGS. 9(a)–9(c) are plan views showing an arrangement of an example of a semiconductor device into which the wiring substrate 50, 60 having positional information of the second embodiment is incorporated.

FIG. 9(a) is a plan view of the semiconductor device before resin sealing is conducted, wherein the semiconductor device is viewed from a face on which the chip is mounted. FIG. 9(b) is a plan view of the semiconductor device after resin sealing is conducted, wherein the semiconductor device is viewed from a face on which the chip is mounted. FIG. 9(c) is a plan view of the semiconductor device, wherein the semiconductor device is viewed from a face on which the balls are mounted. These drawings respectively correspond to the plan views of FIGS. 6(a), 6(b) and 6(c). However, as long as the number of the solder balls 34 is concerned, these drawings do not necessarily correspond to them.

Concerning the side of the substrate on which the solder balls 34 are joined, with respect to plating leader line MP used as "positional information", which is a characteristic of the present invention, in the same manner as that shown in FIG. 6(c), "positional information", is exposed outside through an insulating film such as the solder resist layer 13. However, concerning the side of the substrate on which the semiconductor chip 31 is mounted, being different from the arrangement shown in FIG. 6(b), since the periphery of the substrate is not covered with the sealing resin 33, "positional information" is exposed outside in the portion concerned.

In this second embodiment, plating leader line MP is formed into a peculiar profile in the periphery of each semiconductor element mounting region 51, 61. Therefore, the same effect as that of the first embodiment can be provided.

In order to simplify the explanation, each wiring substrate 10, 50, 60 having positional information of each embodiment described above has a structure of two wiring layers and plating leader lines MP (positional information) are exposed outside so that they can be seen from the outside. However, it should be noted that the present invention is not limited to the above specific embodiment of the two layer wiring structure. Of course, the present invention is not limited to the above specific embodiment of plating leader lines MP.

For example, it is possible to adopt a multiple layer wiring structure in which layers, the number of which is not less than four, are laminated by the well known build-up method. In this case of the multiple layer wiring structure, the plating leader lines (positional information) may be arranged on an internal wiring layer which can not be visually recognized from the outside. An example of this wiring substrate having positional information is shown in FIGS. 10(a) and 10(b).

Figure 10A:
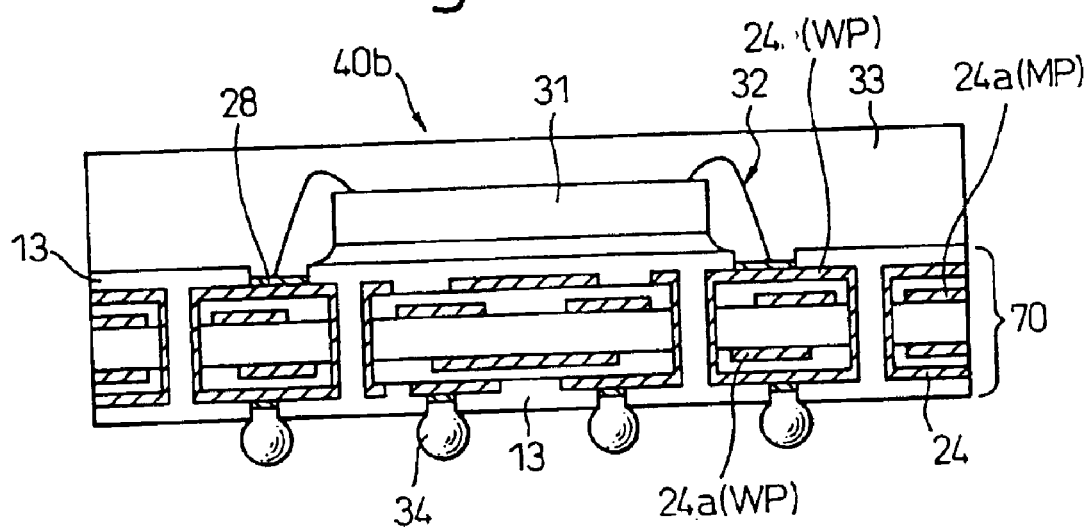
FIGS. 10(a) and 10(b) are sectional views of a semiconductor device into which a wiring substrate having positional information of the third embodiment of the present invention is incorporated.
Figure 10B:
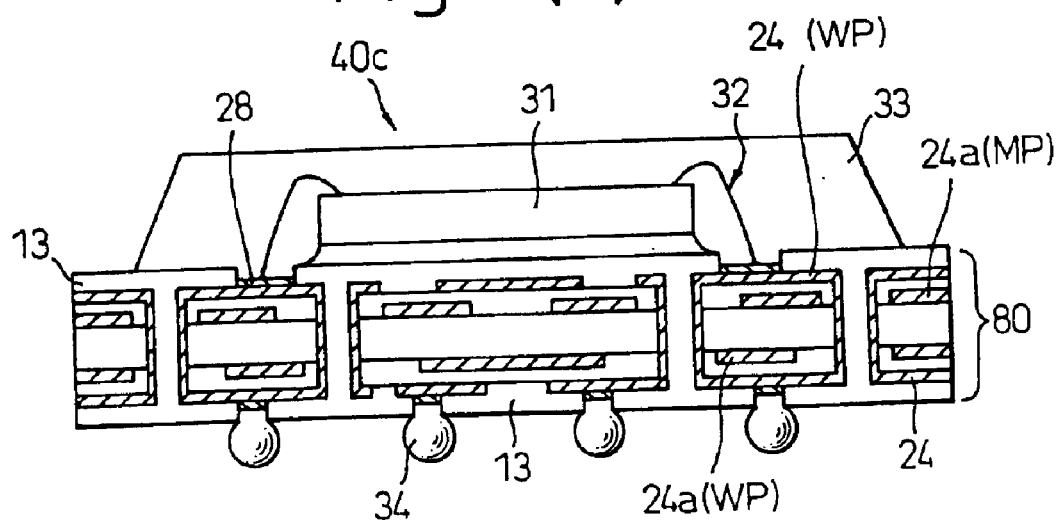

FIG. 10(a) is a sectional view of the semiconductor device 40b of the same type as that of the semiconductor device 40 (shown in FIGS. 5(c) and 6) of the first embodiment. In this type, the entire face of the chip mounting side is covered with the sealing resin 33. FIG. 10(b) is a sectional view of the semiconductor device 40c of the same type as that of the semiconductor device 40a (shown in FIGS. 8 and 9) of the second embodiment. In this type, the face of the chip mounting side except for the peripheral portion is covered with the sealing resin 33.

In the drawing, each of the reference numerals 70 and 80 is a wiring substrate having positional information, and this wiring substrate is composed of a four layer wiring structure. On each wiring substrate 70, 80, plating leader line MP (positional information) is formed on the internal wiring layer (Cu layer) 24a.

In this third embodiment, it is impossible to visually recognize plating leader line MP (positional information) from the outside. Therefore, as a method of discriminating a profile of plating leader line MP arranged inside the substrate, for example, there is provided a method of observing the inside of a product by means of X rays. Further, there is provided a method of observing the inside of a product by breaking the product open, that is, by opening the package.

According to this third embodiment, plating leader line MP is formed into a peculiar profile in the periphery of each semiconductor element mounting region. Therefore, this third embodiment can provide the same effects as those of the first and the second embodiment described before.

Further, even in the case where it is difficult or impossible to give positional information to a face on the ball joining side of the BGA, the pitch of which is fine, as in the conventional technique, the present embodiment can solve the above problems because plating leader line MP is arranged on the internal wiring layer 24a in this embodiment.

In this connection, in the embodiment shown in FIG. 10, plating leader line MP is arranged on the internal wiring layer 24a, however, in the same manner as the first and the second embodiments, of course, it is possible to arrange plating leader line MP on the external wiring layer 24 capable of being recognized from the outside.

In each embodiment described above, as "positional information" for specifying the position of each semiconductor element mounting region (package) on the wiring substrate, plating leader line MP is provided while the profile of each plating leader line MP is changed so that it can be individually distinguished. However, it should be noted that the form of "positional information" is not restricted to this specific embodiment. For example, "positional information" can be composed of numerals or marks. An example of this "positional information" is shown in FIG. 11.

FIG. 11 is a plan view showing an arrangement of a wiring substrate having positional information of the fourth embodiment of the present invention. In the same manner as that shown in FIG. 1 relating to the first embodiment, FIG. 11 is a view in which the wiring substrate 90 having positional information is viewed from the side on which the chips are mounted.

In the drawings, reference numeral 91 is a region in which the semiconductor element is mounted, reference numeral 92 is a slit, reference numeral 93 is a solder resist layer which is a protective film (insulating layer), and reference numeral 94 is a mold gate section. The mode of operation of this mold gate section 94 is the same as that of the mold gate section 14 in the first embodiment. In this connection, the dotted line in the drawing represents a cutting line. Reference mark MQ represents letters (A1, A2, . . . , D9) used a "positional information which is a characteristic of the present invention. Letters MQ are formed simultaneously when the wiring pattern is formed in the same manner as that of the process in which the above plating leader line MP is formed. In this connection, the feeder is not shown in the drawing.

The above fourth embodiment can provide the same effect as that of the first and second embodiments. Further, in the same manner as that of the third embodiment, when the substrate is formed into a four layer wiring structure, it is possible to solve the problems caused in the prior art by attaching letters MQ to the internal wiring layer which can not be visually recognized from the outside.

FIG. 12 is a plan view showing an arrangement of a wiring substrate having positional information of the fifth embodiment of the present invention. In the same manner as that shown in FIG. 1 relating to the first embodiment, FIG. 12 is a view in which the wiring substrate 10a having positional information is viewed from the side on which the chips are mounted.

Different points of the wiring substrate 10a having positional information shown in the drawing from the wiring substrate 10 (shown in FIG. 1) having positional information of the first embodiment are described as follows. On the wiring substrate 10a having positional information, no slits 12 are provided, and the mold gate section 14 is provided corresponding to all the semiconductor element mounting regions 11 which are arranged being formed into a matrix shape of 3×14. Other points of the structure are the same as those of the first embodiment. Therefore, the explanations are omitted here.

FIGS. 13(a) and 13(b) are plan views showing an arrangement of a wiring substrate having positional information of the sixth embodiment of the present invention. In the same manner as that shown in FIG. 11 relating to the fourth embodiment, FIGS. 13(a) and 13(b) are views in which the wiring substrate 90a having positional information is viewed from the side on which the chips are mounted.

Different points of the wiring substrate 90a having positional information shown in the drawing from the wiring substrate 90 (shown in FIG. 11) having positional information of the fourth embodiment are described as follows. On the wiring substrate 90a having positional information, no slits 92 are provided, and the mold gate section 94 is provided corresponding to all the semiconductor element mounting regions 91 which are arranged being formed into a matrix shape of 3×14. In FIG. 13(a), the letters MQ are located at a corner position of the semiconductor element mounting region, and in FIG. 13(b) the letters MQ are located at a central position of the semiconductor region. Other points of the structure are the same as those of the fourth embodiment. Therefore, the explanations are omitted here.

Figure 14A:
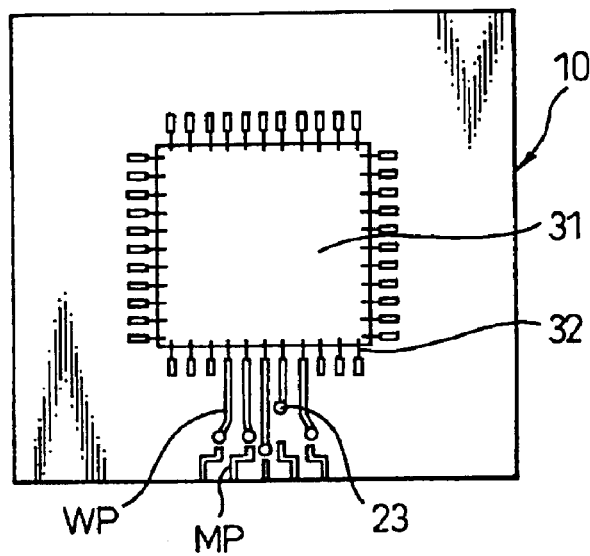
FIGS. 14(a) to 14(c) are plan views showing a model of an example of a structure of a semiconductor device composed of a wiring substrate having positional information of the seventh embodiment of the present invention.
Figure 14B:
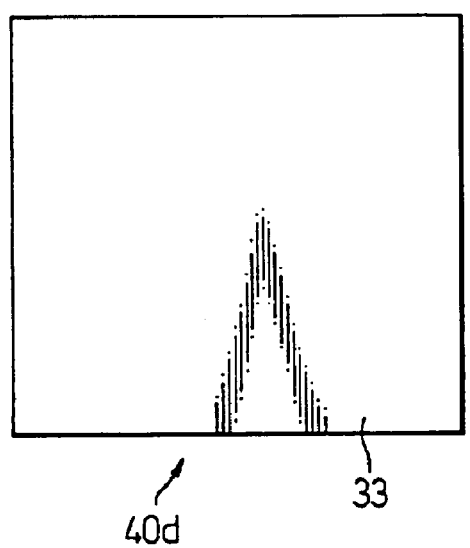
Figure 14C:
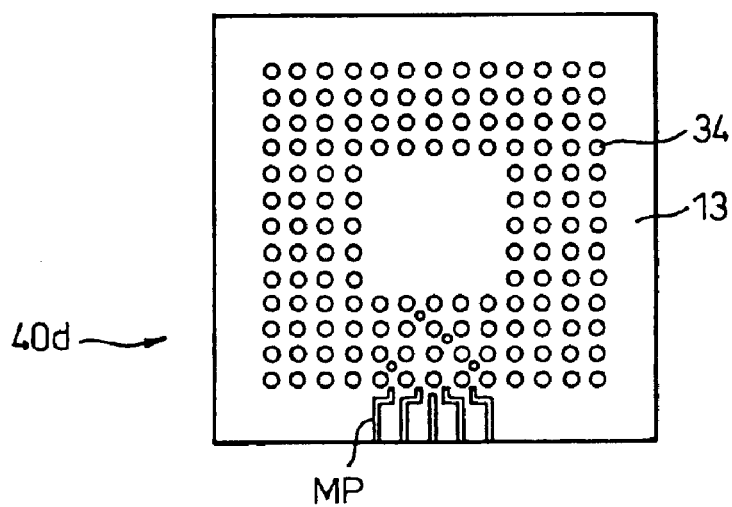

FIGS. 14(a)–14(c) are plan views showing an arrangement of an example of a semiconductor device into which the wiring substrate having positional information of the seventh embodiment is incorporated. In the same manner as that shown in FIGS. 6(a)–6(c), FIG. 14(a) is a plan view of the semiconductor device before resin sealing is conducted, wherein the semiconductor device is viewed from a face on which the chip is mounted. FIG. 14(b) is a plan view of the semiconductor device after resin sealing is conducted, wherein the semiconductor device is viewed from a face on which the chip is mounted. FIG. 14(c) is a plan view of the semiconductor device, wherein the semiconductor device is viewed from a face on which the balls are mounted.

In the semiconductor device 40d of the present embodiment, plating leader line MP, which is used as "positional information", is insulated from a signal line (wiring pattern WP) by the method of etchback as shown in FIG. 14(a).

Figure 15A:
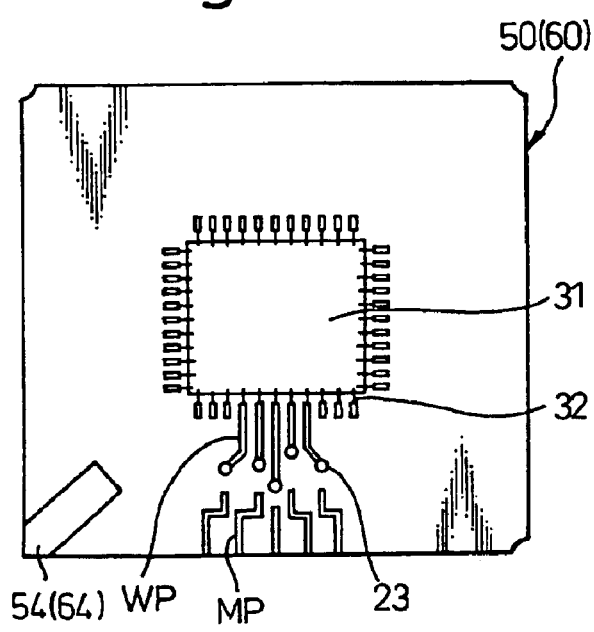
FIGS. 15(a) to 15(c) are plan views showing a model of an example of a structure of a semiconductor device composed of a wiring substrate having positional information of the eighth embodiment of the present invention.
Figure 15B:
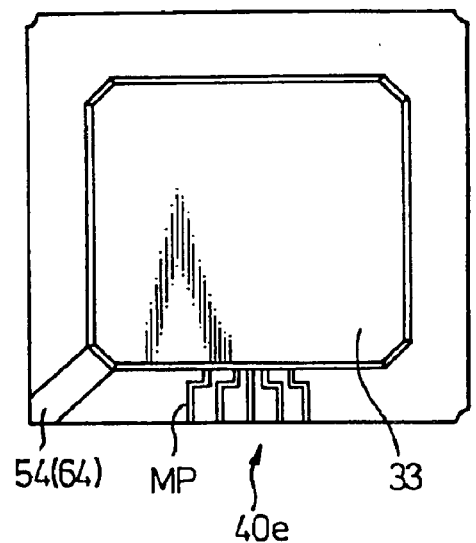
Figure 15C:
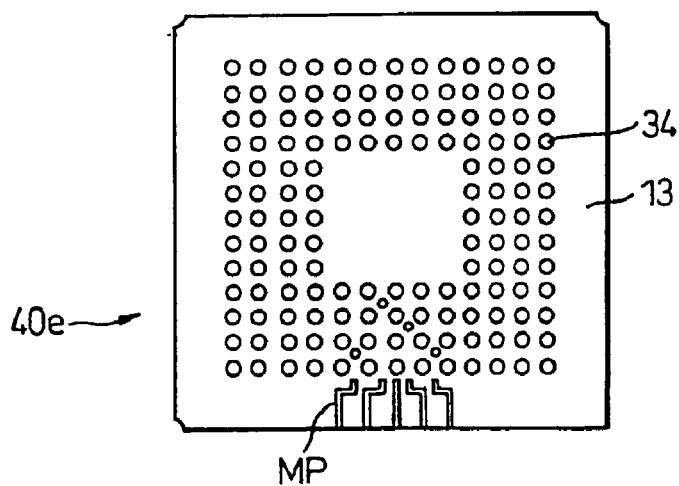

FIGS. 15(a)–15(c) are plan views showing an arrangement of an example of a semiconductor device into which the wiring substrate having positional information of the eighth embodiment is incorporated. In the same manner as that shown in FIGS. 9(a)–9(c), FIG. 15(a) is a plan view of the semiconductor device before resin sealing is conducted, wherein the semiconductor device is viewed from a face on which the chip is mounted. FIG. 15(b) is a plan view of the semiconductor device after resin sealing is conducted, wherein the semiconductor device is viewed from a face on which the chip is mounted. FIG. 15(c) is a plan view of the semiconductor device, wherein the semiconductor device is viewed from a face on which the balls are mounted.

In the same manner as that of the semiconductor device 40d shown in FIGS. 14(a)–14(c), in the semiconductor device 40e of this embodiment, plating leader line MP (positional information) is insulated from a signal line (wiring pattern WP) by the method of etchback as shown in FIG. 15(a).

In this connection, although not shown in the drawing, explanations will be made into a process of manufacturing a wiring substrate having positional information on which plating leader line MP (positional information) is insulated from the signal line (wiring pattern WP) by the etchback method.

(1) In the Case of a Substrate on which Solder Resist is Coated

After a predetermined circuit pattern (wiring layer) has been formed, solder resist is coated. After the solder resist has been hardened, a dry film is stuck on a portion, in which plating solder line MP and signal line WP must be insulated from each other, so as to close an opening of the solder resist. At this time, solder resist is open to the portion in which plating solder line MP and signal line WP must be insulated from each other. Next, plating of Ni/Au conductive layer is conducted. After the completion of Ni/Au plating, the dry film is peeled off. Next, the opening of solder resist on which plating of Ni/Au has been conducted is closed by a dry film. Then, etching is conducted again. In the portion in which plating solder line MP and signal line WP must be insulated from each other, the solder resist is open, and plating solder line MP and signal line WP can be insulated from each other by conducting the above etching. Finally, the dry film is peeled off. In this way, it is possible to complete the manufacture of a wiring substrate having positional information in which plating solder line MP and signal line WP are insulated from each other.

(2) In the Case of a Substrate, the Wiring Layer of which is not Coated with an Insulating Film of Solder Resist After a predetermined circuit pattern (wiring layer) has been formed, a portion, on which it is unnecessary to conduct plating of Ni/Au, is coated with a dry film. Next, plating of Ni/Au conductive layer is executed so as to form a plated layer of Ni/Au. Then, the dry film is peeled off. Next, a portion except for the portion in which plating leader line MP and signal line WP must be insulated from each other, including the portion in which plating of Ni/Au has been conducted, is covered with a dry film. Then, etching is conducted again. As the portion in which plating leader line MP and signal line WP must be insulated from each other is not coated with the dry film, plating leader line MP and signal line WP can be insulated from each other when etching is conducted as described above. Finally, the dry film is peeled off. In this way, it is possible to complete the manufacture of a wiring substrate having positional information in which plating solder line MP and signal line WP are insulated from each other.

FIGS. 16(a) to 18(c) are views showing a manufacturing process of a wiring substrate having positional information of the ninth embodiment of the present invention. In FIGS. 16(a) to 18(c), a case is shown, as an example, in which the wiring structure is composed of one layer and a conductive section (wiring layer) is not coated with an insulating film on the wiring substrate having positional information.

The manufacturing process of this embodiment corresponds to the method of the above item (2) by which a wiring substrate having positional information, on which plating leader line MP (positional information) is insulated from the signal line (wiring pattern WP) by the etchback method, is manufactured. The manufacturing method of this embodiment is essentially the same as that of the wiring substrate of two layer wiring structure shown in FIGS. 3(a) to 4(d). Like reference characters are used to indicate like components in FIGS. 2 to 4 and FIGS. 16 to 18. Therefore, specific explanations of each manufacturing process is omitted here, however, each manufacturing process will be briefly explained as follows.

Figure 16A:
FIGS. 16(a) to 16(d), 17(a) to 17(d) and 18(a) to 18(c) are respectively sectional views showing a process of manufacturing a wiring substrate having positional information of the ninth embodiment.
Figure 16B:
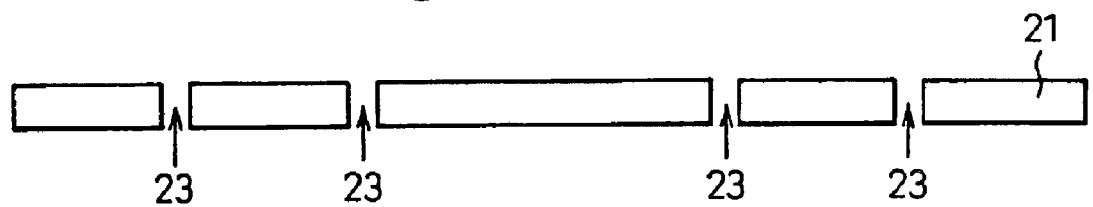
Figure 16C:
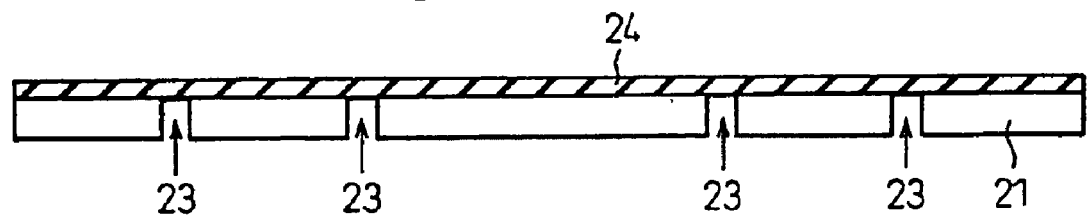
Figure 16D:
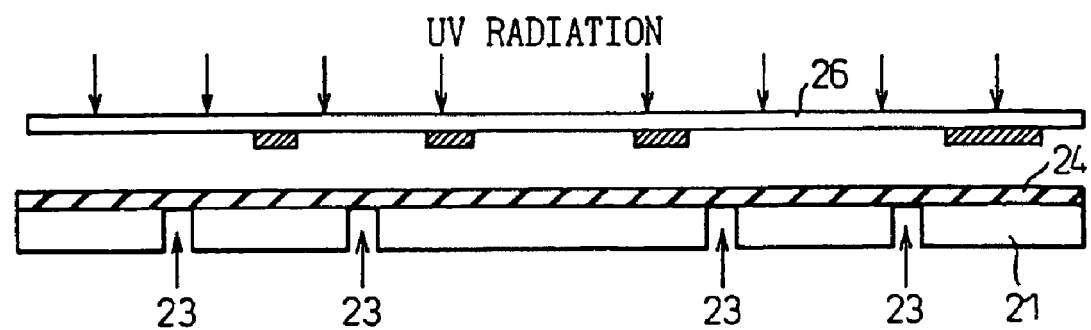
Figure 17A:
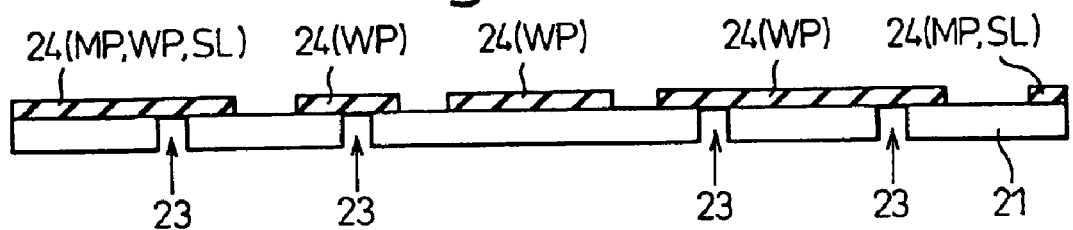
Figure 17B:
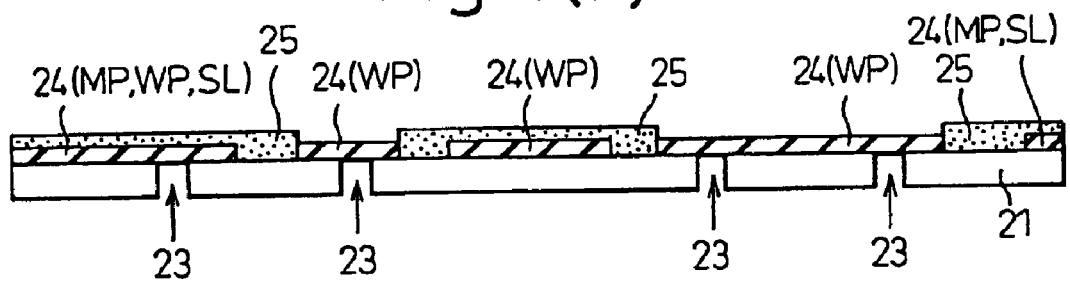
Figure 17C:
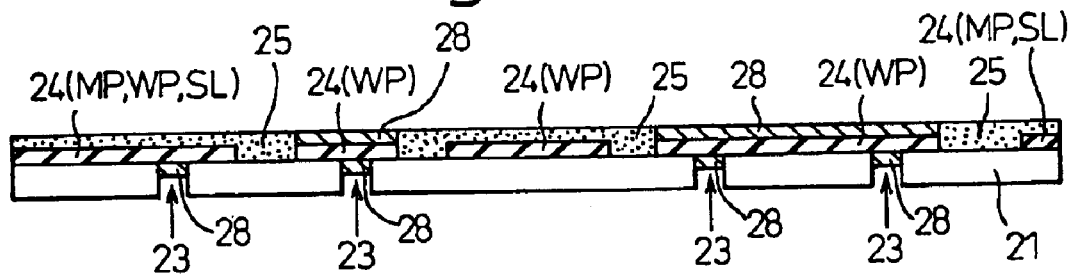
Figure 17D:
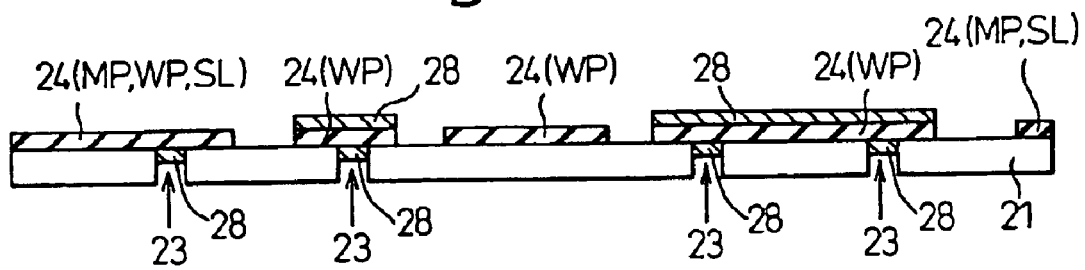
Figure 18A:
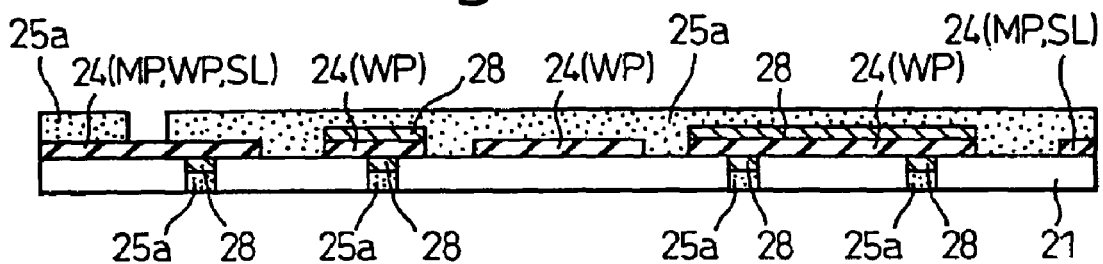
Figure 18B:
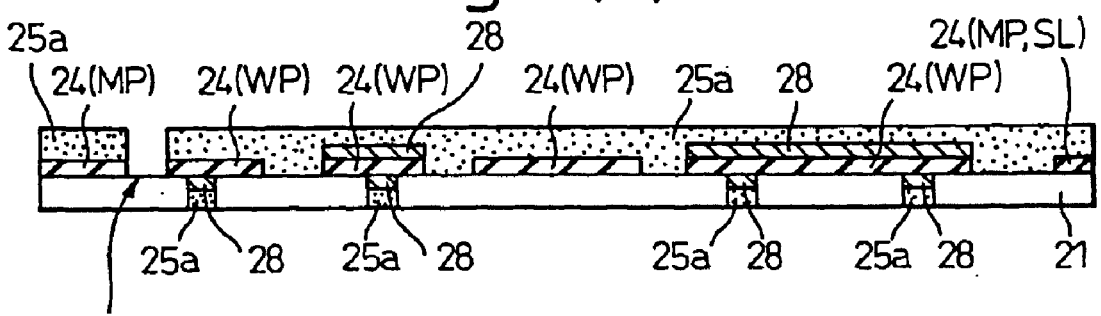
Figure 18C:
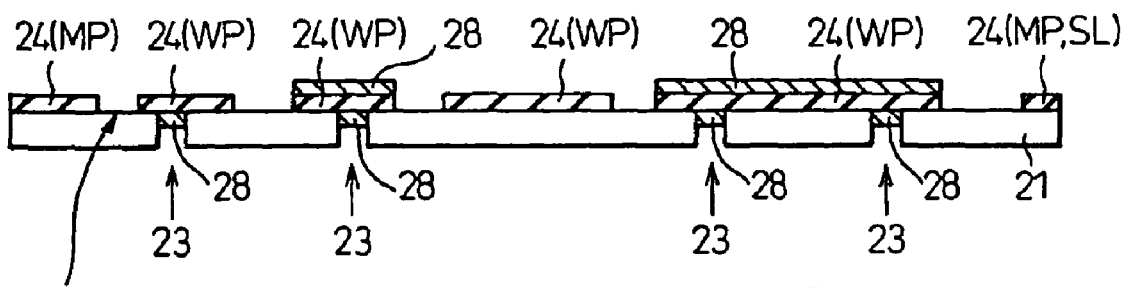

First, the core substrate 21 shown in FIG. 16(a) is prepared so that it can be used as base material. Then, through-holes 23 are formed on the core substrate 21 as shown in FIG. 16(b), and the conductive layer 24 is formed as shown in FIG. 16(c). The conductive layer 24 is subjected to exposure and development by using the mask 26, that is, patterning is conducted on the conductive layer 24 as shown in FIG. 16(d), so that a predetermined wiring pattern WP and plating leader line MP (including feeder SL), which are composed of portions of the conductive layer 24, are formed as shown in FIG. 17(a). Then, the dry film 25 is stuck as shown in FIG. 17(b). The conductive layer 28 is formed by the plating of Ni/Au as shown in FIG. 17(c). After that, the dry film 25 is peeled off as shown in FIG. 17(d). Next, a portion except for the portion in which plating leader line MP and signal line WP must be insulated from each other, including the portion in which plating of Ni/Au has been conducted, is covered with the dry film 25a as shown in FIG. 18(a). Then, etching (etchback) is conducted as shown in FIG. 18(b), and the dry film 25a is peeled off as shown in FIG. 18(c).

Figure 19A:
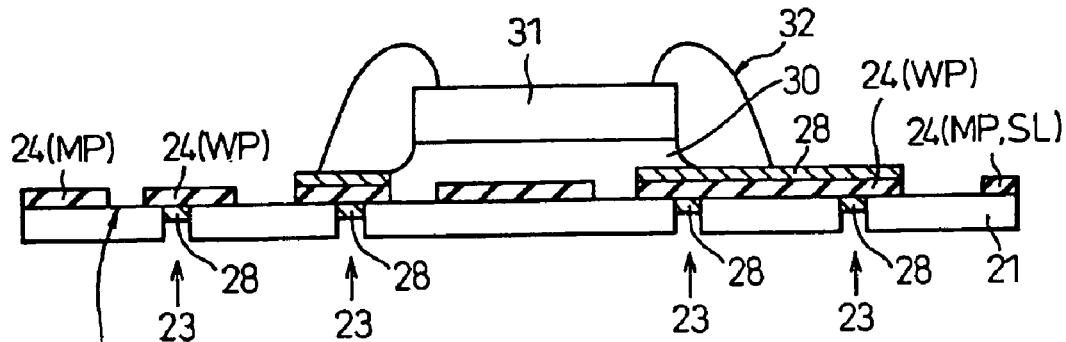
FIGS. 19(a) to 19(c) are sectional views showing a process of manufacturing a semiconductor device into which a wiring substrate of the ninth embodiment is incorporated.
Figure 19B:
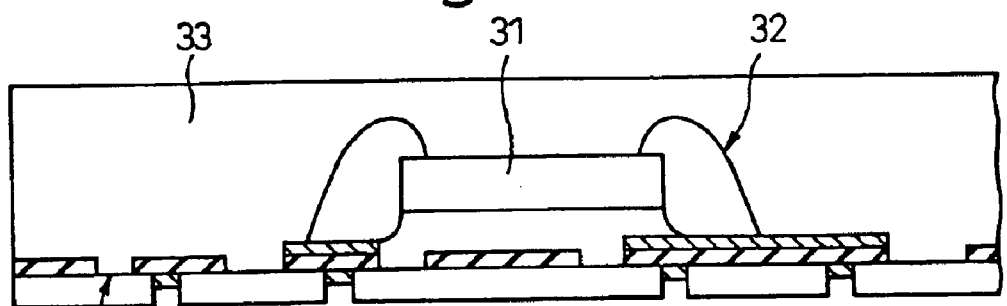
Figure 19C:
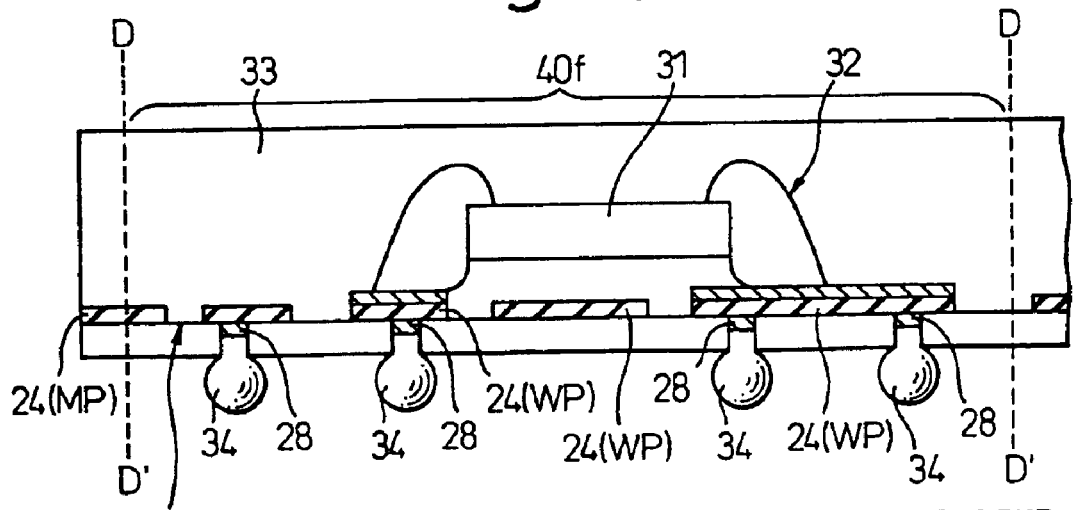

FIGS. 19(a)–19(c) are views showing a process of manufacturing a semiconductor device into which a wiring substrate having positional information manufactured by the manufacturing process shown in FIGS. 16 to 18 is incorporated. The process of manufacturing the semiconductor device 40f of this embodiment, which is shown in FIGS. 19(a) to 19(c), is the same as the process of manufacturing the semiconductor device 40 shown in FIG. 5. Therefore, the explanations of the manufacturing process will be omitted here.

Figure 20A:
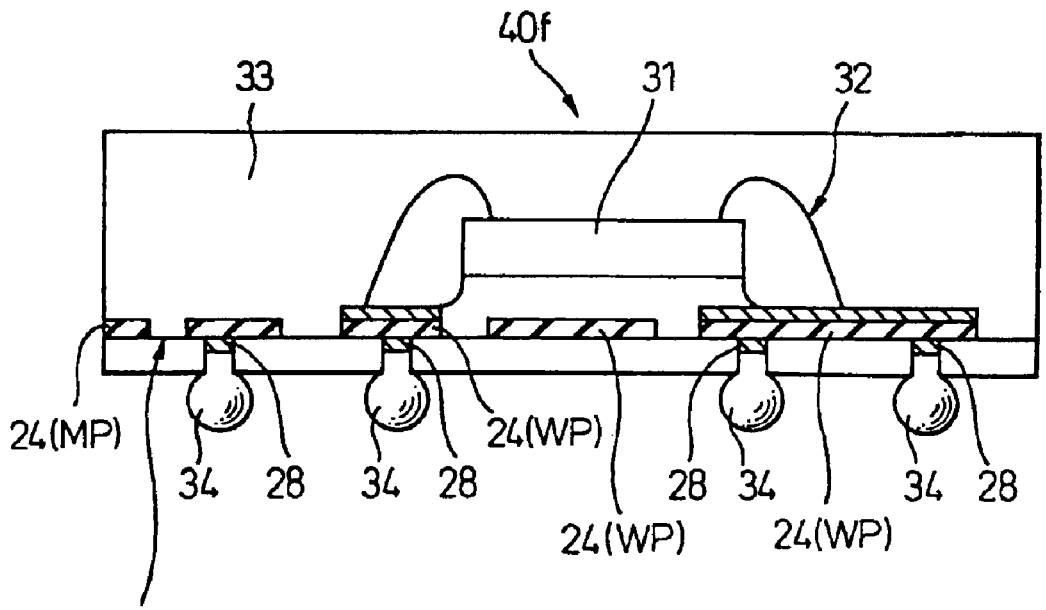
FIGS. 20(a) and 20(b) are sectional views showing a structure of a semiconductor device composed of a wiring substrate of the ninth embodiment.
Figure 20B:
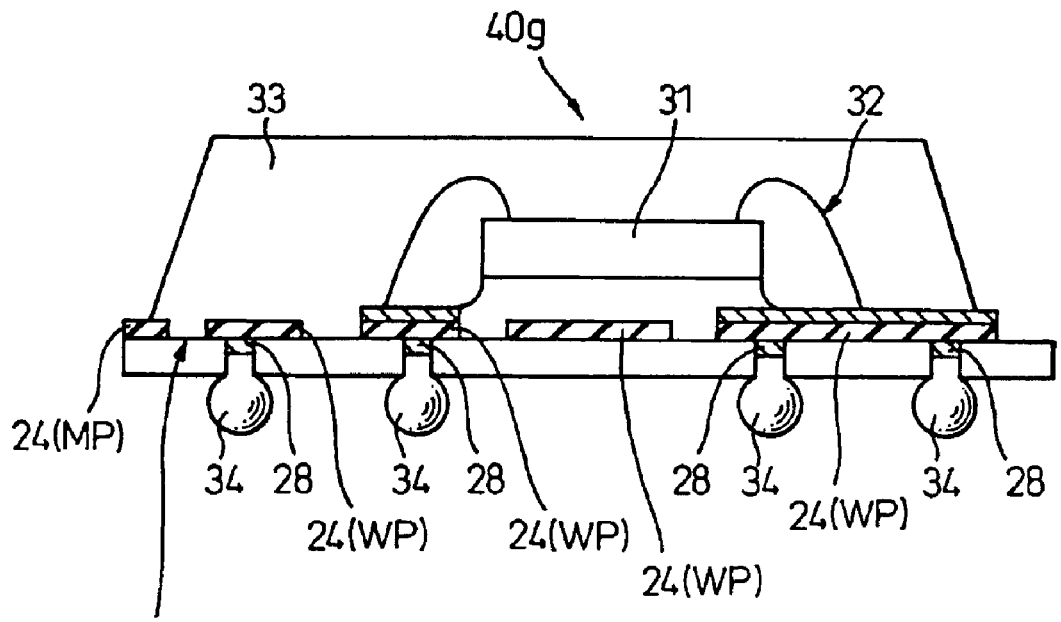

FIGS. 20(a) and 20(b) are sectional views showing a cross-sectional structure of a semiconductor device into which a wiring substrate having positional information manufactured by the manufacturing process shown in FIGS. 16(a) to 18(c) is incorporated.

FIG. 20(a) is a view showing a cross-sectional structure of the semiconductor device 40f of the same type as that of the semiconductor device 40b shown in FIG. 10(a), that is, FIG. 20(a) is a view showing a cross-sectional structure of the semiconductor device 40f of the type in which the entire chip mounting face is covered with the sealing resin 33. FIG. 20(b) is a view showing a cross-sectional structure of the semiconductor device 40g of the same type as that of the semiconductor device 40c shown in FIG. 10(b), that is, FIG. 20(b) is a view showing a cross-sectional structure of the semiconductor device 40g of the type in which the entire chip mounting face except for the periphery is covered with the sealing resin 33.

In each embodiment described above, on both the ball joining face and the chip mounting face, positional information (plating leader line MP and letters MQ) is given. However, as can be clearly seen in the scope of claim of the present invention, it is sufficient that such positional information is given to at least one face side of the wiring layer.

As explained above, according to the present invention, it is possible to quickly feed back the result of failure analysis to the manufacturing process. Therefore, the efficiency of failure analysis can be highly enhanced.

What is claimed is:

1. A process of manufacturing a wiring board of semiconductor package, the process comprising:
   forming a wiring layer of wiring patterns on at least one of first and second surfaces of a base substrate; and
   simultaneously forming individual patterns as position information for respective semiconductor element mounting areas on the surface of the base substrate on which the wiring layer is formed, a shape of the individual patterns in one of the semiconductor element mounting areas being different than a shape of the individual patterns in any other of the semiconductor element mounting areas.

2. A process as set forth in claim 1, wherein the individual patterns as position information are parts of the wiring patterns of the wiring layer which comprises signal lines and plating power supply lines; and the process further comprising:
   disconnecting the plating power supply lines from the signal lines.

3. A process as set forth in claim 2, wherein the plating power supply lines are disconnected from the signal lines by etching back.

4. A process of manufacturing a wiring board of semiconductor package, the process comprising:
   forming at least two wiring layers with respective wiring patterns on at least one of first and second surfaces of a base substrate via respective insulating layers; and
   forming individual patterns as position information provided for the respective semiconductor element mounting areas, a shape of the individual patterns in one of the semiconductor element mounting areas being different than a shape of the individual patterns in any other of the semiconductor element mounting areas.

5. A process as set forth in claim 4, wherein the individual patterns as position information are parts of the wiring patterns of the wiring layer which comprises signal lines and plating power supply lines; and the process further comprising:
   disconnecting the plating power supply lines from the signal lines.

6. A process as set forth in claim 5, wherein the plating power supply lines are disconnected from the signal lines by etching back.

7. A process of manufacturing a semiconductor device comprising:
   forming a wiring layer of wiring patterns on at least one of first and second surfaces of a base substrate;
   simultaneously forming individual patterns as position information for respective semiconductor element mounting areas on the surface of the base substrate on which the wiring layer is formed, a shape of the individual patterns in one of the semiconductor element mounting areas being different than a shape of the individual patterns in any other of the semiconductor element mounting areas;
   mounting a plurality of semiconductor chips each having electrodes on the substrate;
   electrically connecting the electrodes of the semiconductor chips to the wiring pattern with bonding wires;
   sealing the semiconductor chips and the bonding wires;
   adhering external connecting terminals on the opposite surface of the substrate on which the individual patterns as position information are provided; and separating respective units of semiconductor devices from the substrate.

8. A process of manufacturing a semiconductor package, the process comprising:

forming at least two wiring layers with respective wiring patterns formed on at least one of first and second surfaces of a base substrate via respective insulating layers;

forming individual patterns as position information for the respective semiconductor element mounting areas, a shape of the individual patterns in one of the semiconductor element mounting areas being different than a shape of the individual patterns in any other of the semiconductor element mounting areas;

mounting a plurality of semiconductor chips each having electrodes on the substrate;

electrically connecting the electrodes of the semiconductor chips to the wiring pattern with bonding wires;

sealing the semiconductor chips and the bonding wires;

adhering external connecting terminals on the opposite surface of the substrate on which the individual patterns as position information are provided; and separating respective units of semiconductor devices from the substrate.

* * * * *